United States Patent
Siau et al.

(10) Patent No.: US 9,196,362 B2
(45) Date of Patent: *Nov. 24, 2015

(54) MULTIPLE LAYER FORMING SCHEME FOR VERTICAL CROSS POINT RERAM

(71) Applicant: SanDisk 3D LLC, Milpitas, CA (US)

(72) Inventors: Chang Siau, Saratoga, CA (US); Tianhong Yan, San Jose, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/246,053

(22) Filed: Apr. 5, 2014

(65) Prior Publication Data
US 2014/0301131 A1  Oct. 9, 2014

Related U.S. Application Data

(60) Provisional application No. 61/809,206, filed on Apr. 5, 2013.

(51) Int. Cl.
*G11C 13/00* (2006.01)

(52) U.S. Cl.
CPC ........ *G11C 13/0069* (2013.01); *G11C 2213/71* (2013.01); *G11C 2213/77* (2013.01)

(58) Field of Classification Search
None
See application file for complete search history.

(56) References Cited

U.S. PATENT DOCUMENTS

| 8,289,749 | B2 | 10/2012 | Chen |
| 8,462,580 | B2 | 6/2013 | Rabkin |
| 2004/0240255 | A1* | 12/2004 | Smith et al. ............ 365/158 |
| 2009/0097295 | A1 | 4/2009 | Morimoto |
| 2010/0054019 | A1* | 3/2010 | Toda ...................... 365/148 |
| 2010/0178729 | A1* | 7/2010 | Yoon et al. ............. 438/104 |
| 2011/0299340 | A1 | 12/2011 | Samachisa |

OTHER PUBLICATIONS

Siau, U.S. Appl. No. 14/246,052, filed Apr. 5, 2014.
Siau, U.S. Appl. No. 14/197,136, filed Mar. 4, 2014.
Siau, U.S. Appl. No. 13/781,503, filed Feb. 28, 2013.
Office Action dated Jun. 30, 2015, U.S. Appl. No. 14/246,052.
Response to Office Action dated Jul. 25, 2015, U.S. Appl. No. 14/246,052.
Siau, et al., "Vertical Cross Point Reram Forming Method," U.S. Appl. No. 14/732,766, filed Jun. 7, 2015.
Notice of Allowance dated Apr. 27, 2015, U.S. Appl. No. 14/246,052.
Notice of Allowance dated Aug. 31, 2015, U.S. Appl. No. 14/246,052.

* cited by examiner

*Primary Examiner* — James G Norman
(74) *Attorney, Agent, or Firm* — Vierra Magen Marcus LLP

(57) ABSTRACT

Methods for forming non-volatile storage elements in a non-volatile storage system are described. In some embodiments, during a forming operation, a cross-point memory array may be biased such that waste currents are minimized or eliminated. In one example, the memory array may be biased such that a first word line comb is set to a first voltage, a second word line comb interdigitated with the first word line comb is set to the first voltage, and selected vertical bit lines are set to a second voltage such that a forming voltage is applied across non-volatile storage elements to be formed. In some embodiments, a memory array may include a plurality of word line comb layers and a forming operation may be concurrently performed on non-volatile storage elements on all of the plurality of word line comb layers or a subset of the plurality of word line comb layers.

25 Claims, 27 Drawing Sheets

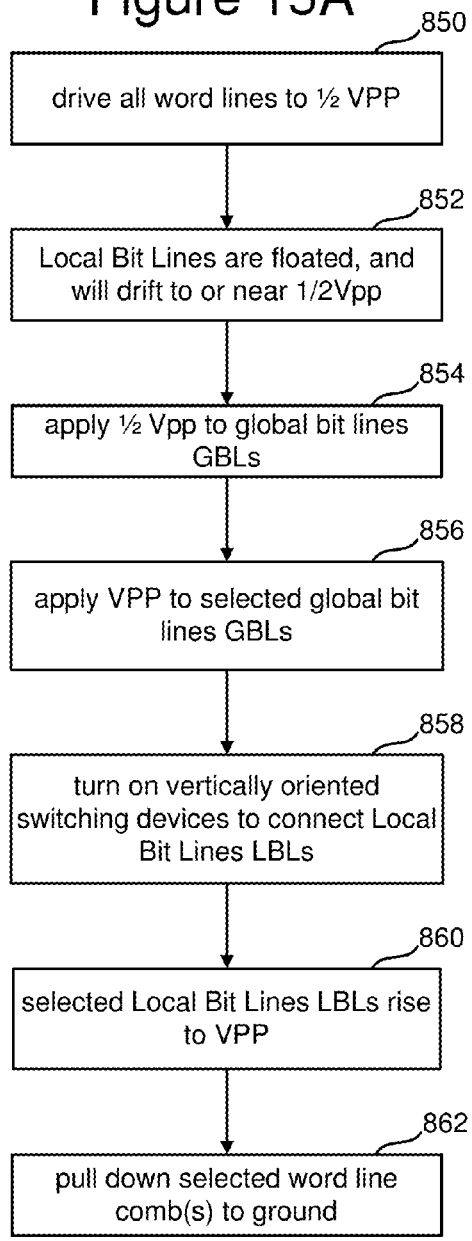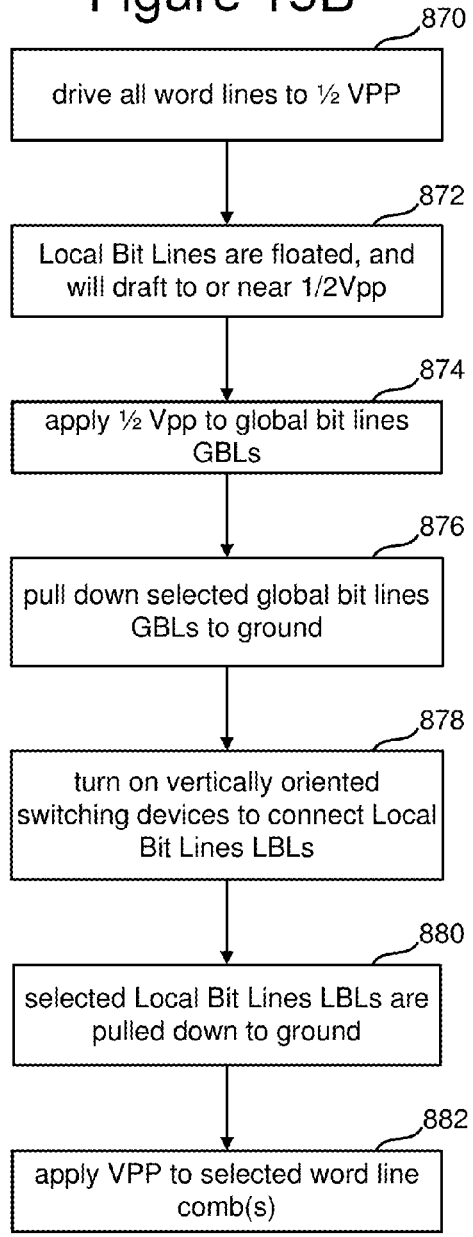

US 9,196,362 B2

MULTIPLE LAYER FORMING SCHEME FOR VERTICAL CROSS POINT RERAM

CLAIM OF PRIORITY

The present application claims priority to U.S. Provisional Application No. 61/809,206, entitled "VERTICAL CROSS POINT RERAM FORMING METHOD," filed Apr. 5, 2013, which is herein incorporated by reference in its entirety.

BACKGROUND OF THE INVENTION

1. Field of the Invention

The present invention relates to technology for non-volatile storage.

2. Description of the Related Art

One example of non-volatile memory uses variable resistance memory elements that may be set to either a low resistance state or a high resistance state. The variable resistance memory elements may be individually connected between two conductors (e.g., a bit line electrode and a word line electrode). The state of such a memory element is typically changed by proper voltages being placed on the intersecting conductors.

Some variable resistance memory elements may be in the high resistance state when first fabricated. The term "FORMING" is sometimes used to describe putting the variable resistance memory elements into a lower resistance state for the first time after fabrication. After a FORMING operation is performed, the variable resistance memory elements may be RESET to the high resistance state and then SET again to a low resistance state.

One theory that is used to explain the FORMING mechanism, as well as the switching mechanism to RESET and SET the variable resistance memory elements, is that one or more conductive filaments are formed by the application of a voltage to the variable resistance memory elements. One example of a variable resistance memory element includes a metal oxide as the variable (reversible) resistance material. In response to a suitable voltage, a conductive filament may be formed in the metal oxide such that there is one or more conductive paths from the top electrode to the bottom electrode of the variable resistance memory element. The conductive filament lowers the resistance of the variable resistance memory element. Application of another voltage may rupture the conductive filaments, thereby increasing the resistance of the variable resistance memory element. Application of still another voltage may repair the rupture in the conductive filament, thereby decreasing the resistance of the variable resistance memory element once again. The initial formation of the conductive filament may be referred to as "FORMING," the rupture of the filament may be referred to as RESETTING and the repair of the rupture of the filament may be referred to as SETTING. The variable resistance memory element may then be repeatedly switched between states by repeatedly RESETTING and SETTING the variable resistance memory element. The RESETTING process puts the variable resistance memory element in the high resistance state and the SETTING process puts the variable resistance memory element in the low resistance state. Data values may then be assigned to the high resistance state and the low resistance state.

The FORMING process may impact the ability of the variable resistance memory element to exhibit proper switching behavior over time. For example, the variable resistance memory element may switch consistently between the high resistance state and the low resistance state in response to appropriate voltages, which may be referred to as "switching within the intended window."

BRIEF DESCRIPTION OF THE DRAWINGS

FIGS. 15A and 15B are flow charts describing embodiments for programming the memory system.

DETAILED DESCRIPTION

Figure 1:
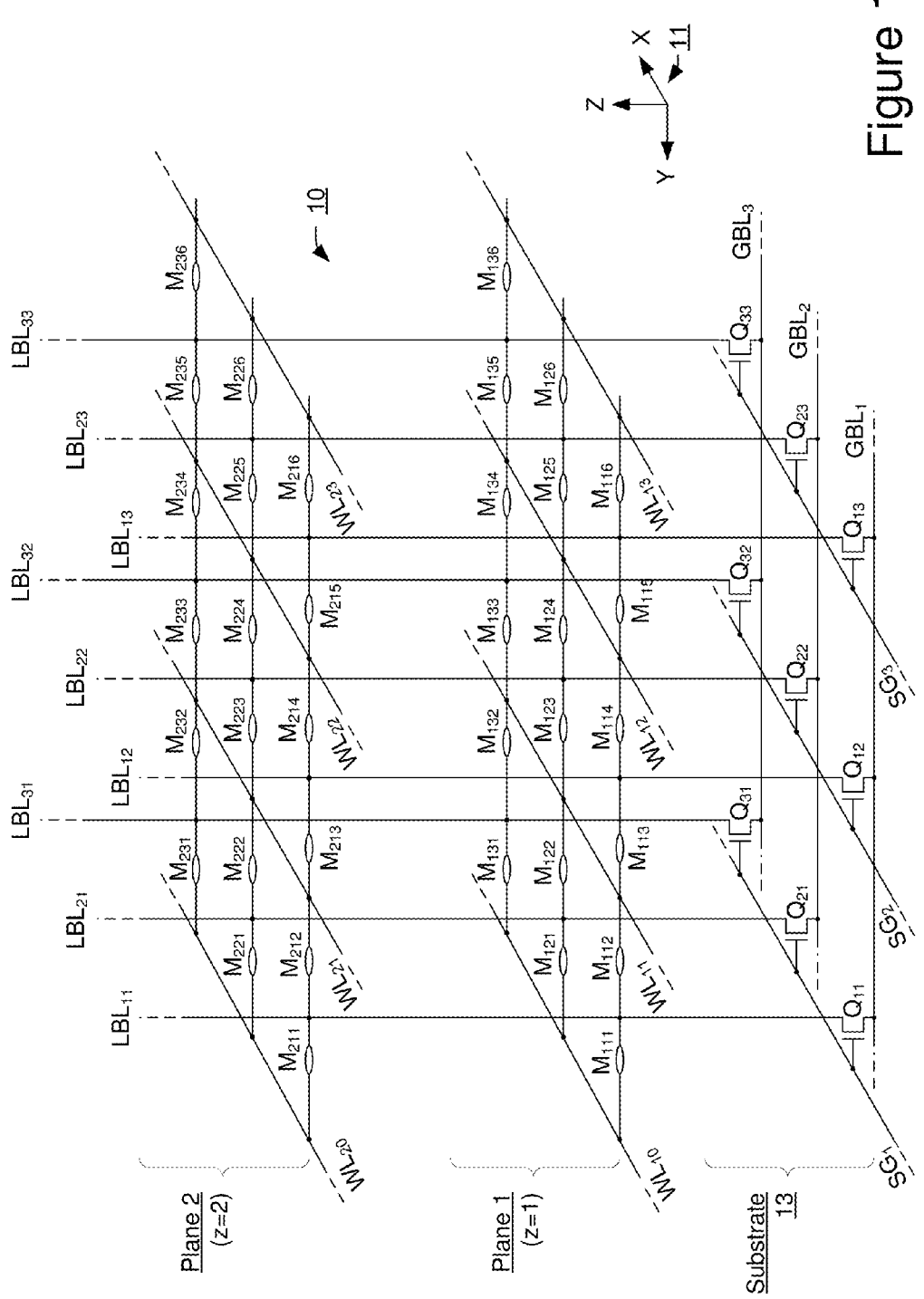
FIG. 1 is an equivalent circuit of a portion of an example three-dimensional array of variable resistance memory elements, wherein the array has vertical bit lines.

Technology is described for forming non-volatile storage elements in a non-volatile storage system. The non-volatile storage system may include a three-dimensional cross-point memory array with vertical bit lines or bit lines that are arranged orthogonal to a semiconductor substrate. The cross-point memory array may include rewriteable non-volatile memory cells, wherein each memory cell includes a reversible resistance-switching element without an isolation element in series with the reversible resistance-switching element (e.g., no diode in series with the reversible resistance-switching element). In some embodiments, a plurality of forming operations may be performed in which non-volatile storage elements located near the far end of a plurality of word line fingers associated with a word line comb (e.g., a word line comb including 9 fingers or 18 interleaved fingers) are formed prior to forming other non-volatile storage elements located closer to the base of the word line comb. In one example, non-volatile storage elements may be formed in each of the plurality of word line fingers in parallel and in an order that forms non-volatile storage elements in each of the plurality of word line fingers that are located near the far ends of the plurality of word line fingers before forming other non-volatile storage elements in each of the plurality of word line fingers that are located closer to the base of the word line comb. In some cases, each non-volatile storage element of the non-volatile storage elements in each of the plurality of word line fingers that are formed during a particular forming operation may be current limited (e.g., to 1 μA) while a forming voltage (e.g., 3V) is applied across the non-volatile storage element. In one example, current limiting of a non-volatile storage element during a forming operation may be performed by a vertical TFT in series with a vertical bit line connected to the non-volatile storage element. In some cases, after a first forming operation of the plurality of forming operations has been performed, the non-volatile storage elements formed during the first forming operation may be reset from a lower resistance state into a higher resistance state prior to performing a second forming operation of the plurality of forming operations.

In some embodiments, each of the non-volatile storage elements connected to a word line comb may be assigned to one of a plurality of groups, wherein each group of the plurality of groups includes non-volatile storage elements located within a particular distance (or within a particular distance range) from a base of the word line comb. The word line comb may include word line fingers. Each group may include one or more non-volatile storage elements per word line finger. In one example, a first group of non-volatile storage elements may comprise each of the farthest bits at the ends of a plurality of word line fingers connected to the base of the word line comb. A second group of non-volatile storage elements may include non-volatile storage elements that are adjacent to the farthest bits at the ends of the plurality of word line fingers (e.g., the second group may include each of the non-volatile storage elements that are neighboring the farthest bits associated with each of the plurality of word line fingers). In this case, the first group of non-volatile storage elements may be formed during a first forming operation that is performed prior to a second forming operation that forms the second group of non-volatile storage elements.

In some embodiments, during a first forming operation of a plurality of forming operations, non-volatile storage elements associated with a first number of word line combs may be formed and during a second forming operation of the plurality of forming operations subsequent to the first forming operation, non-volatile storage elements associated with a second number of word line combs less than the first number may be formed. In this case, as the number of formed non-volatile storage elements in a non-volatile storage system increases, the number of word line combs activated for forming additional non-volatile storage elements may decrease. In some cases, as the non-volatile storage elements being formed during a subsequent forming operation get closer to a base of a word line comb (or farther away from the ends of the fingers of the word line comb), the number of non-volatile storage elements being formed during the subsequent forming operation per word line finger may increase. Thus, although the number of word line combs activated for forming non-volatile storage elements may decrease over time as more non-volatile storage elements are formed, the number of non-volatile storage elements formed per word line finger (and per word line comb) may increase.

In one embodiment, during a forming operation, a memory array may be biased such that a selected word line comb is set to a first voltage (e.g., VPP or 3V), an unselected word line comb is set to a second voltage less than the first voltage (e.g., 0.5*VPP or 1.5V), and a selected vertical bit line connected to a first finger of the selected word line comb via a non-volatile storage element is set to 0V. In this case, waste currents (e.g., through partially biased non-volatile storage elements connected to the selected vertical bit line and unselected word line combs) may be significant and limit the number of non-volatile storage elements that may be formed in parallel and/or at the same time. In another embodiment, during a forming operation, a memory array may be biased such that waste currents (e.g., from partially biased H and/or F memory cells) are minimized or eliminated. In one example, a memory array may be biased such that a first word line comb is set to a first voltage (e.g., VPP or 3V), a second word line comb adjacent to (or interdigitated with) the first word line comb is set to the first voltage, unselected vertical bit lines are set to the first voltage or floated, and selected vertical bit lines are set to 0V. In another example, a memory array may be biased such that a first word line comb is set to a first voltage (e.g., 0V), a second word line comb adjacent to (or interdigitated with) the first word line comb is set to the first voltage, unselected vertical bit lines are set to the first voltage or floated, and selected vertical bit lines are set to a second voltage greater than the first voltage (e.g., 3V).

In some cases, the methods for forming non-volatile storage elements described herein may be used for performing non-data pattern memory array operations (e.g., erase operations and preconditioning operations). The methods for forming non-volatile storage elements described herein may also be used for data pattern-dependent memory array operations. In some embodiments, a plurality of programming operations (e.g., data-dependent write operations) may be performed in which non-volatile storage elements located near the far end of a plurality of word line fingers associated with a word line comb are programmed prior to non-volatile storage elements located closer to the base of the word line comb. In one example, non-volatile storage elements may be programmed in each of the plurality of word line fingers in parallel and in an order that programs non-volatile storage elements in each of the plurality of word line fingers that are located near the far ends of a plurality of word line fingers before programming other non-volatile storage elements. In some cases, each non-volatile storage element in each of the plurality of word line fingers that are programmed during a particular programming operation may be current limited while a programming voltage (e.g., 2V) is applied across the non-volatile storage element. In one example, current limiting of a non-volatile storage element during a programming operation may be performed by a vertical TFT in series with a vertical bit line connected to the non-volatile storage element.

One issue with forming non-volatile storage elements that are arranged in a cross-point memory array in which the non-volatile storage elements do not include an isolation element (e.g., a diode) is that once a particular non-volatile storage element is formed, its lower resistance may cause a significant amount of current to be drawn which in turn may make it more difficult to form other non-volatile storage elements. In one example, a far bit (or non-volatile storage element) on a word line finger with substantial word line resistance (e.g., 150 ohms/square) may not be able to be formed if other bits on the word line finger are in a low resistance state causing a substantial IR drop to occur along the word line finger. One benefit of forming bits located near the far ends of a plurality of word line fingers in parallel before forming other bits connected to the plurality of word line fingers and/or providing current limiting and non-volatile storage element resetting during a forming operation is that the time to form non-volatile storage elements may be reduced and the voltage requirements for forming the non-volatile storage elements may be reduced.

In some embodiments, a semiconductor memory array may include a cross-point memory array. A cross-point memory array comprises a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

During a memory array operation, the word lines and bit lines of a cross-point memory array may be biased or set to various voltages to support the memory array operation. At the intersection of a selected word line and a selected bit line is a selected memory cell (an S cell). The voltage across the S cell is the difference between the selected word line voltage and the selected bit line voltage. Memory cells at the intersections of the selected word line and the unselected bit lines comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line and the unselected word lines comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines and the unselected bit lines comprise unselected memory cells (U cells). The voltage across the U cells is the difference between the unselected word line voltage and the unselected bit line voltage. More information regarding cross-point memory arrays including reversible resistance-switching elements may be found in U.S. Patent Application Publication No. 2006/0250836, entitled "REWRITEABLE MEMORY CELL COMPRISING A DIODE AND A RESISTIVITY-SWITCHING MATERIAL," which is herein incorporated by reference in its entirety. More information regarding vertical bit line three-dimensional memory arrays may be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

One embodiment includes a three-dimensional array of memory elements that can be set to a first state and reset to a second state during operation by biasing appropriate voltages on the word lines and bit lines. Prior to operation, the memory elements may undergo a forming operation, during which current through the bit lines is limited. A forming voltage is applied to the memory elements during forming with a polarity such that a given bit line acts as a cathode and the appropriate word line acts as an anode, with the cathode having a lower electron injection energy barrier to the switching material than the anode. Such a configuration provides for a more controlled and accurate forming method that does not damage the memory device.

The memory elements used in the three-dimensional array are preferably variable resistive memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture described herein may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities.

In addition, the three-dimensional architecture herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The term connected refers to direct and indirect connections.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array may be reduced, thereby reducing the cost of the resulting integrated circuit.

Referring initially to FIG. 1, an architecture of one example embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two.

In one embodiment, the word lines and bit lines of a memory array may cross at an angle equal to or about 90 degrees. In another embodiment, the word lines and bit lines of a memory array may cross at an angle equal to or about 60 degrees. More information regarding memory arrays including a plurality of memory cells arranged in a substantially hexagonal pattern can be found in U.S. Pat. No. 7,746,680, entitled "Three Dimensional Hexagonal Matrix Memory Array," which is herein incorporated by reference in its entirety.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate 13. Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 2:
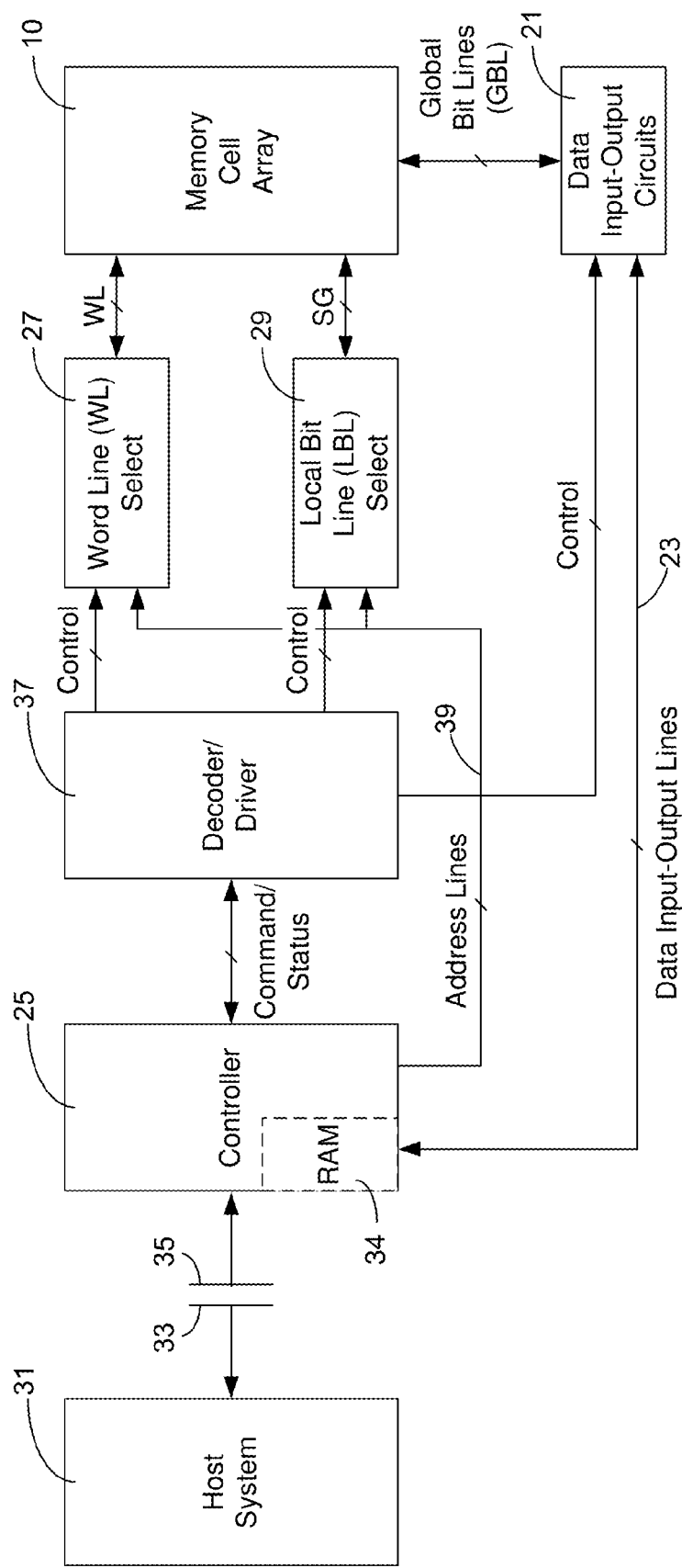
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, th local bit line select e circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array. In one embodiment, any one or combination of Controller 25, decoder/driver circuits 37, circuits 21, 27 and 29, or other control logic can be referred to as one or more control circuits.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, controllers, and so forth. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are reprogrammed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
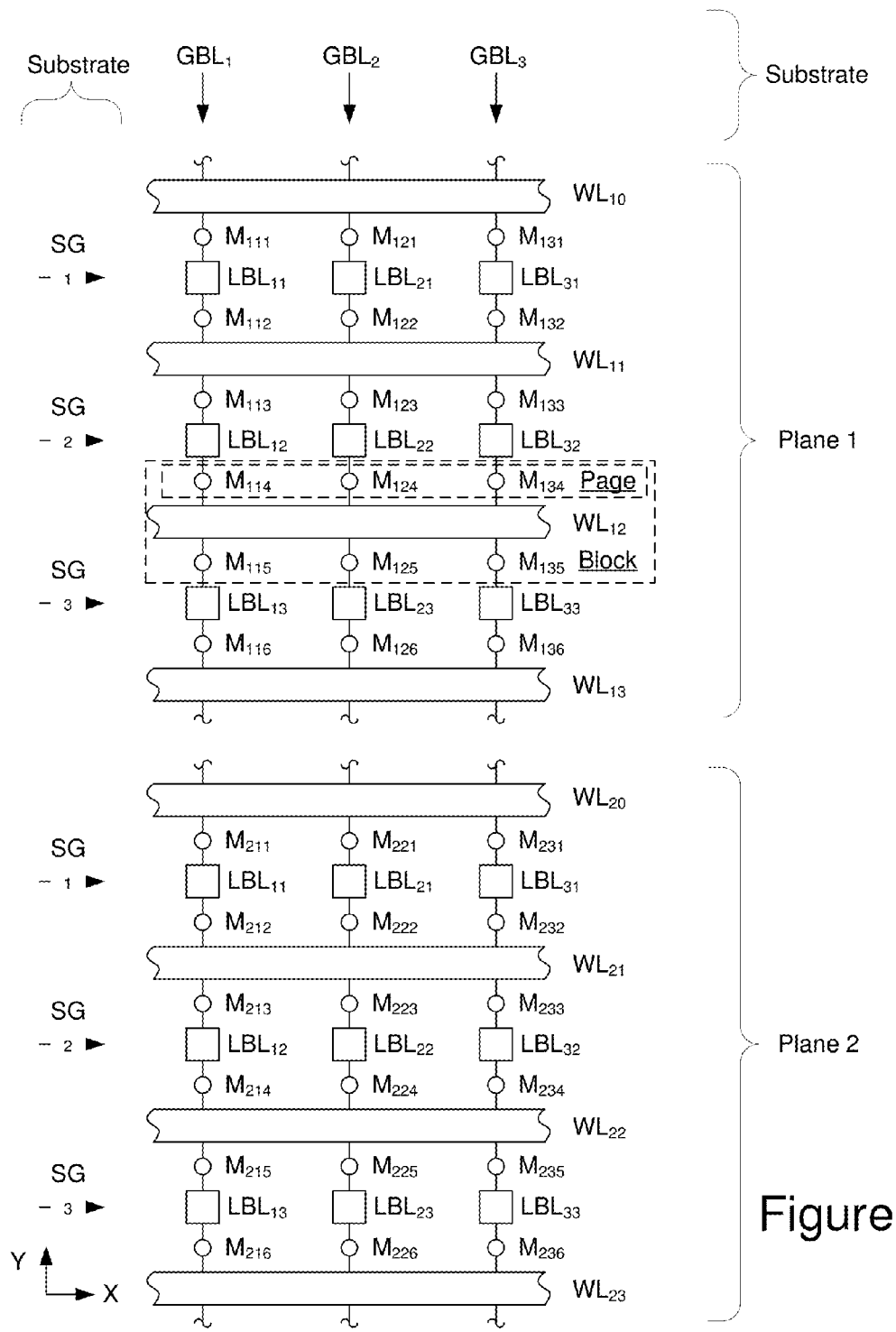
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.

2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
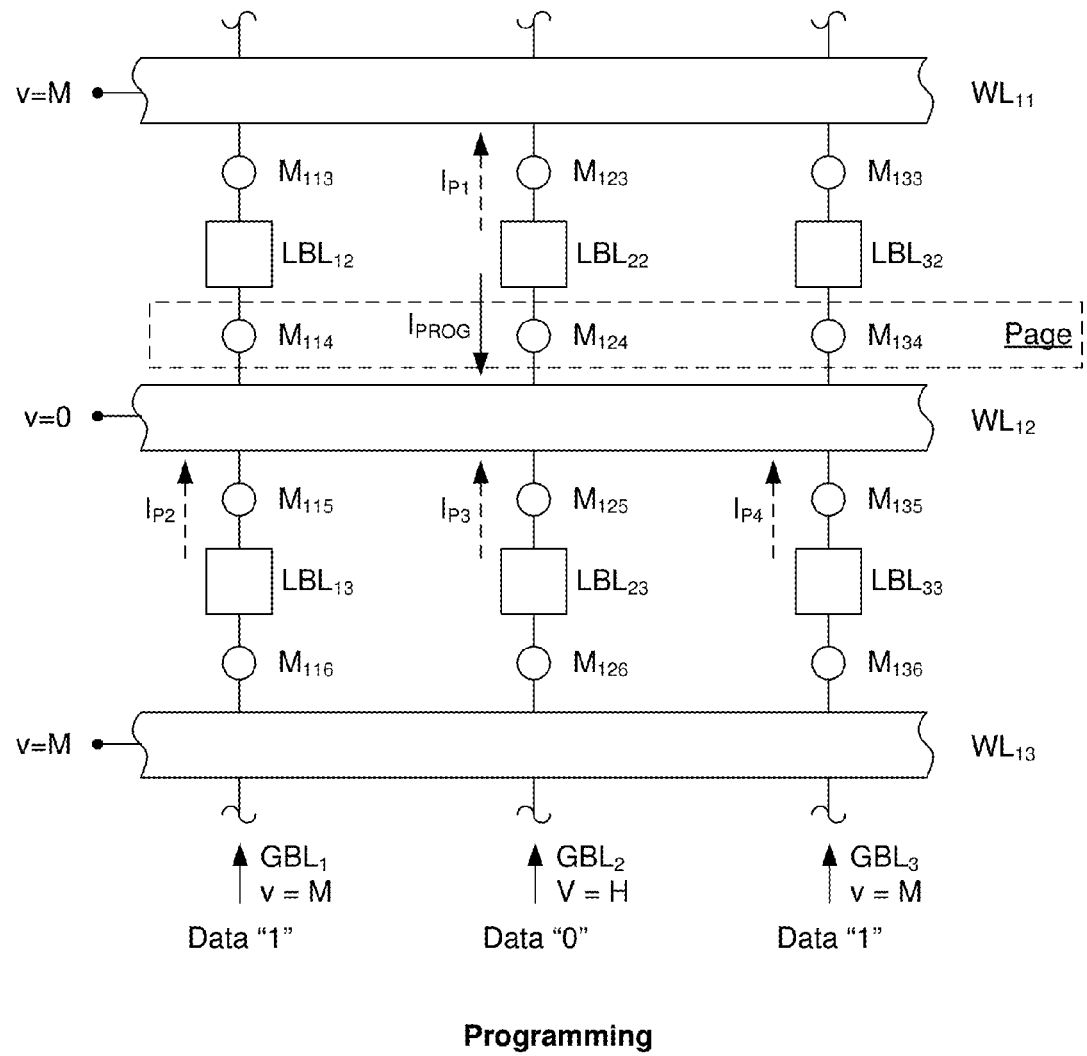
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed.

Figure 5:
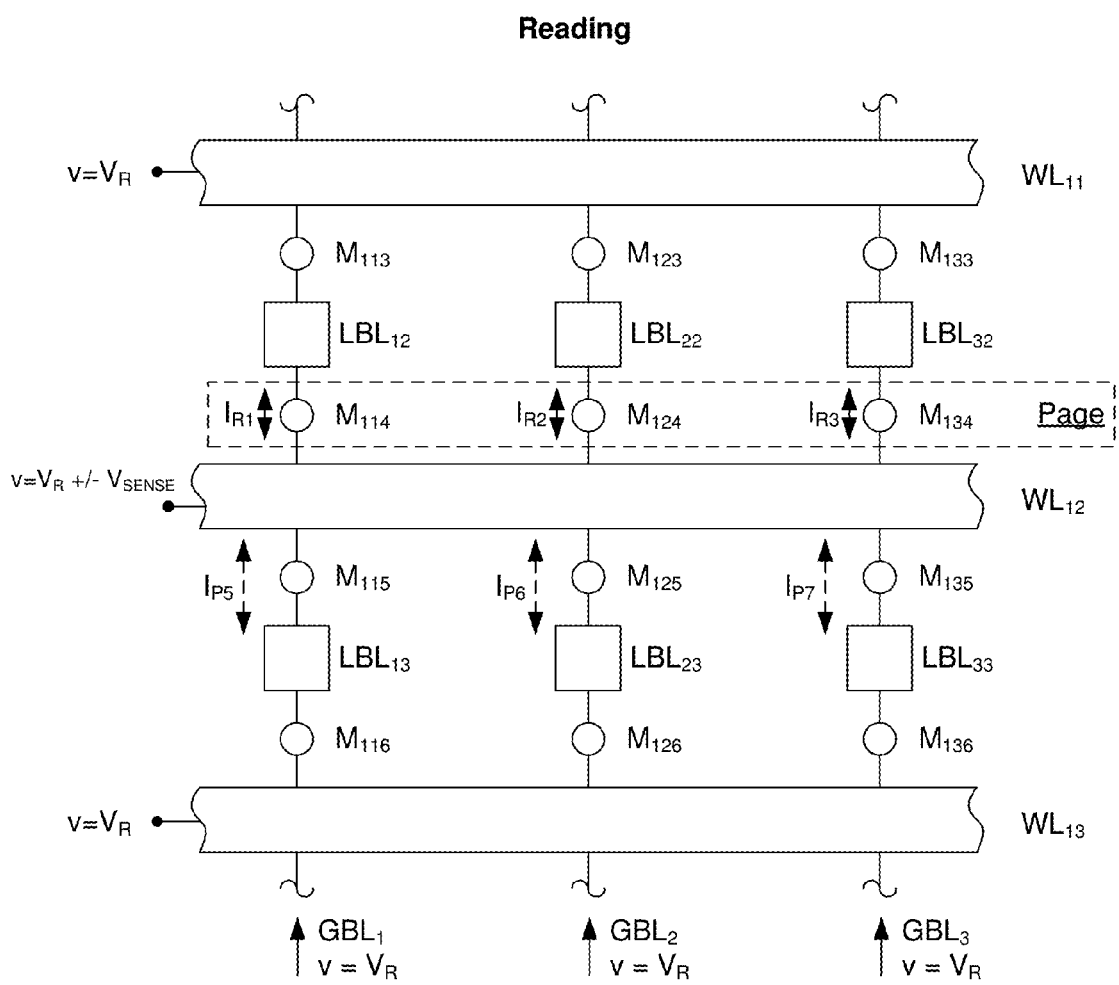
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.

4. Sense current flowing into ($V_R$+Vsense) or out of ($V_R$-Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V$sense without flowing through the sense amplifiers. These parasitic currents will not flow through the selected local bit lines (LBL$_{12}$, LBL$_{22}$ and LBL$_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

The material used for the non-volatile memory elements $M_{zxy}$ in the array of FIG. 1 can be a chalcogenide, a metal oxide (MeOx), CMO, or any one of a number of materials that exhibit a stable, reversible shift in resistance in response to an external voltage applied to or current passed through the material.

Metal oxides (MeOx) are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include $\alpha$-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state).

The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Figure 6:
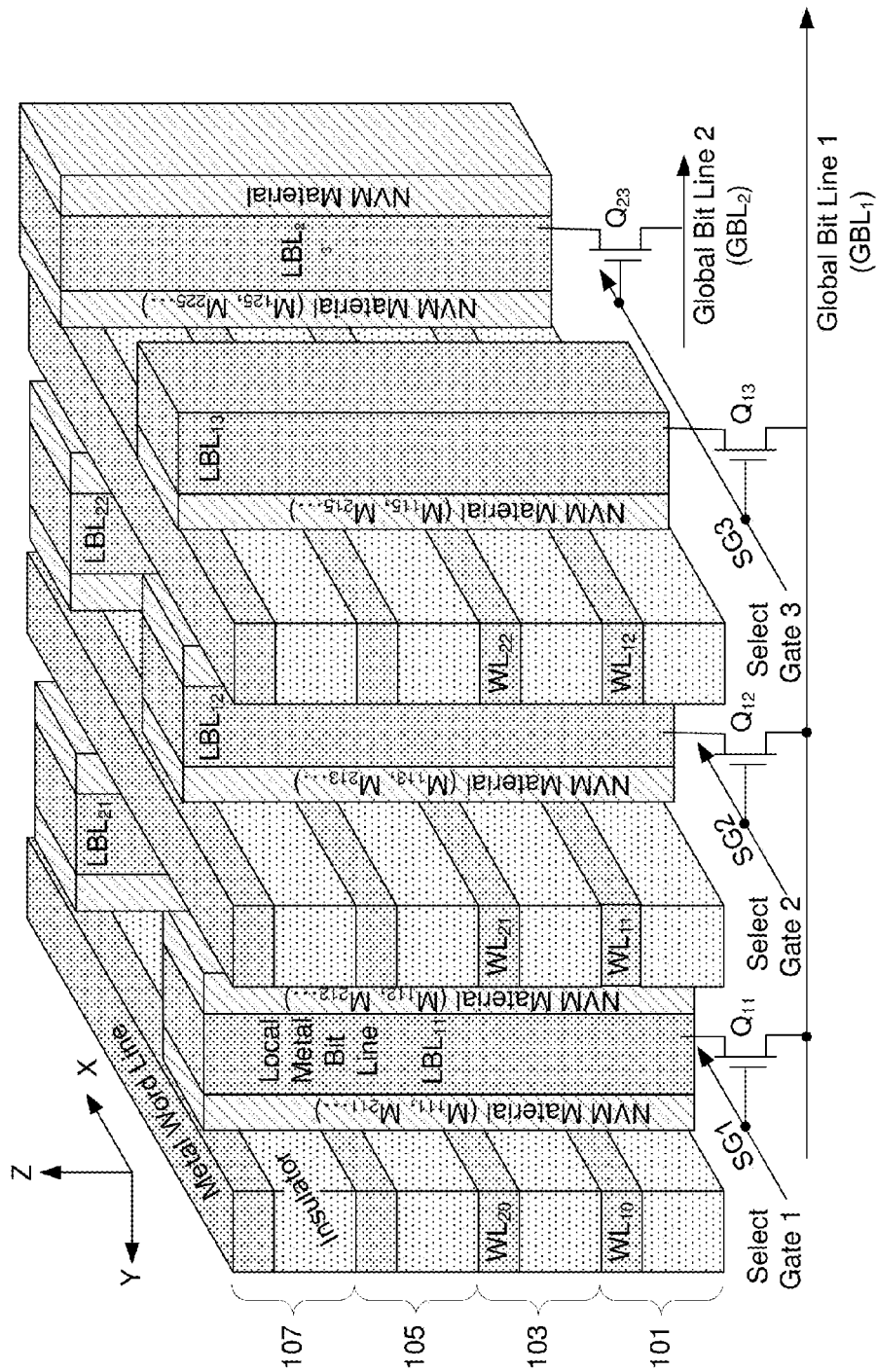
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.

2. Alternating layers of dielectric (insulator) and metal are formed as sheets on top of each other and over at least the area of the substrate in which the select devices Q are formed. In the example of FIG. 6, four such sheets are formed.

3. These sheets are then etched (isolated) by using a mask formed over the top of them that has slits elongated in the x-direction and spaced apart in the y-direction. All of the material is removed down to the etch stop in order to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).

4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.

5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

To enable the memory to be denser (e.g., more memory elements per area), the size of the memory elements can be made smaller and the memory elements can be arranged closer to each other than in the past. To enable the memory elements to be closer to each other, one embodiment uses a vertically oriented select device (e.g., three terminal switch and/or select transistor) for connecting the individual local bit line pillars to the respective global bit lines. For example, the select devices $Q_{11}, Q_{12}, \ldots, Q_{21}, Q_{22}, \ldots$ of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller.

For example, a pillar shaped Thin Film Transistor (TFT) FET or JFET can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
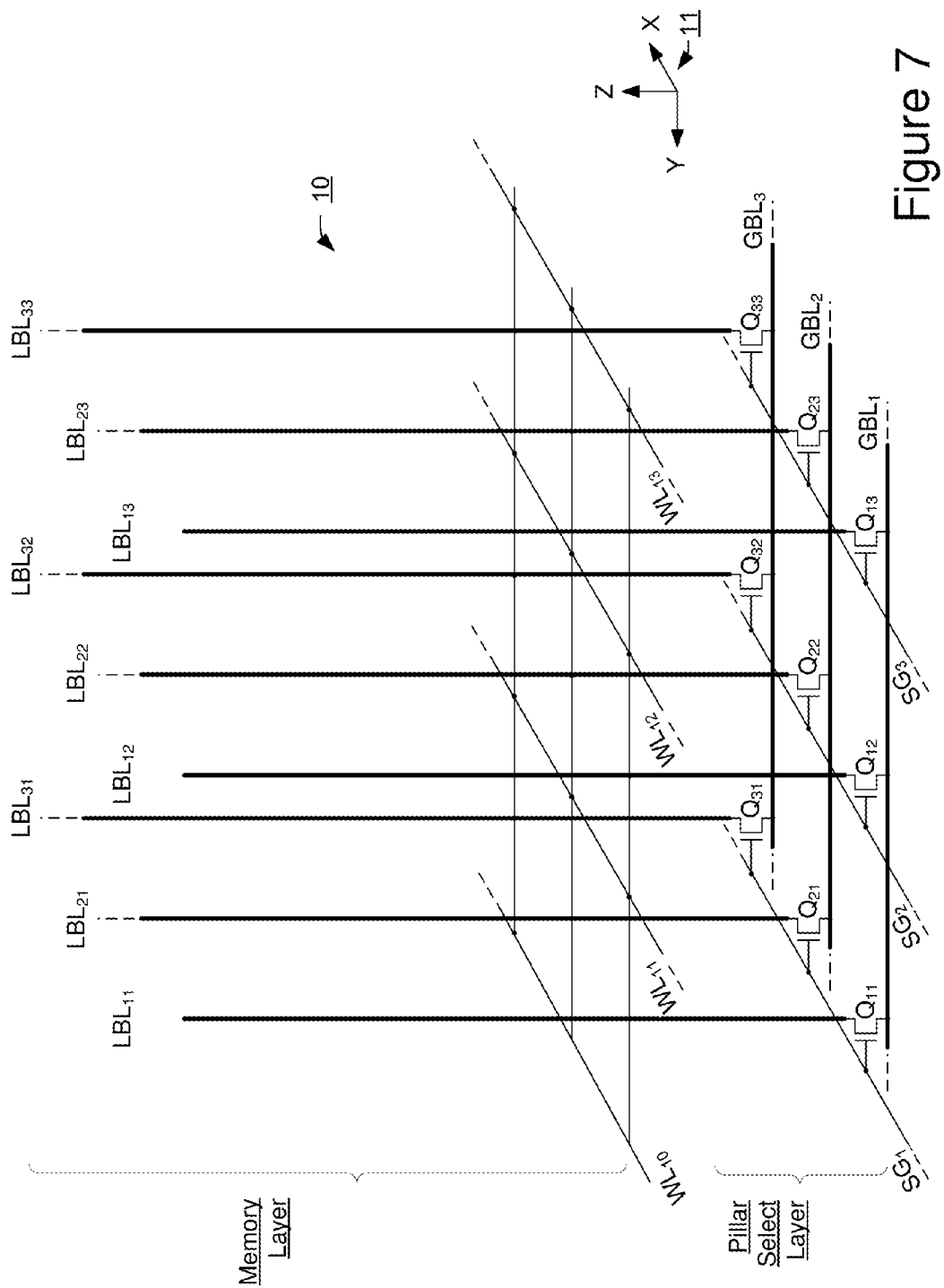
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}, Q_{12}, \ldots, Q_{21}, Q_{22}, \ldots$, etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}, W_{11}, \ldots$, etc. without showing the memory elements that exist between each crossing of a word line and a bit line.

Figure 8B:
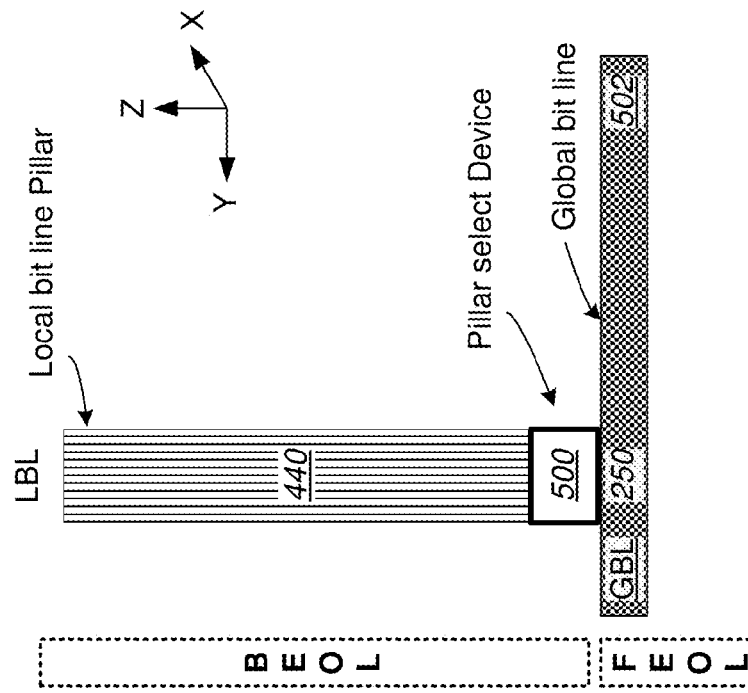
FIG. 8B is a plan view that depicts a vertical bit line, a vertically oriented select device and a global bit line.
Figure 8A:
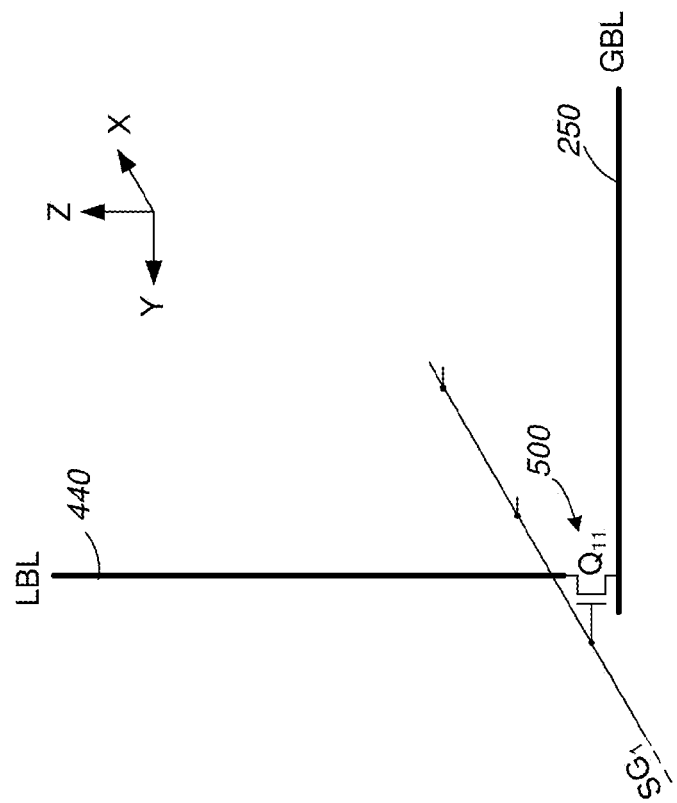
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
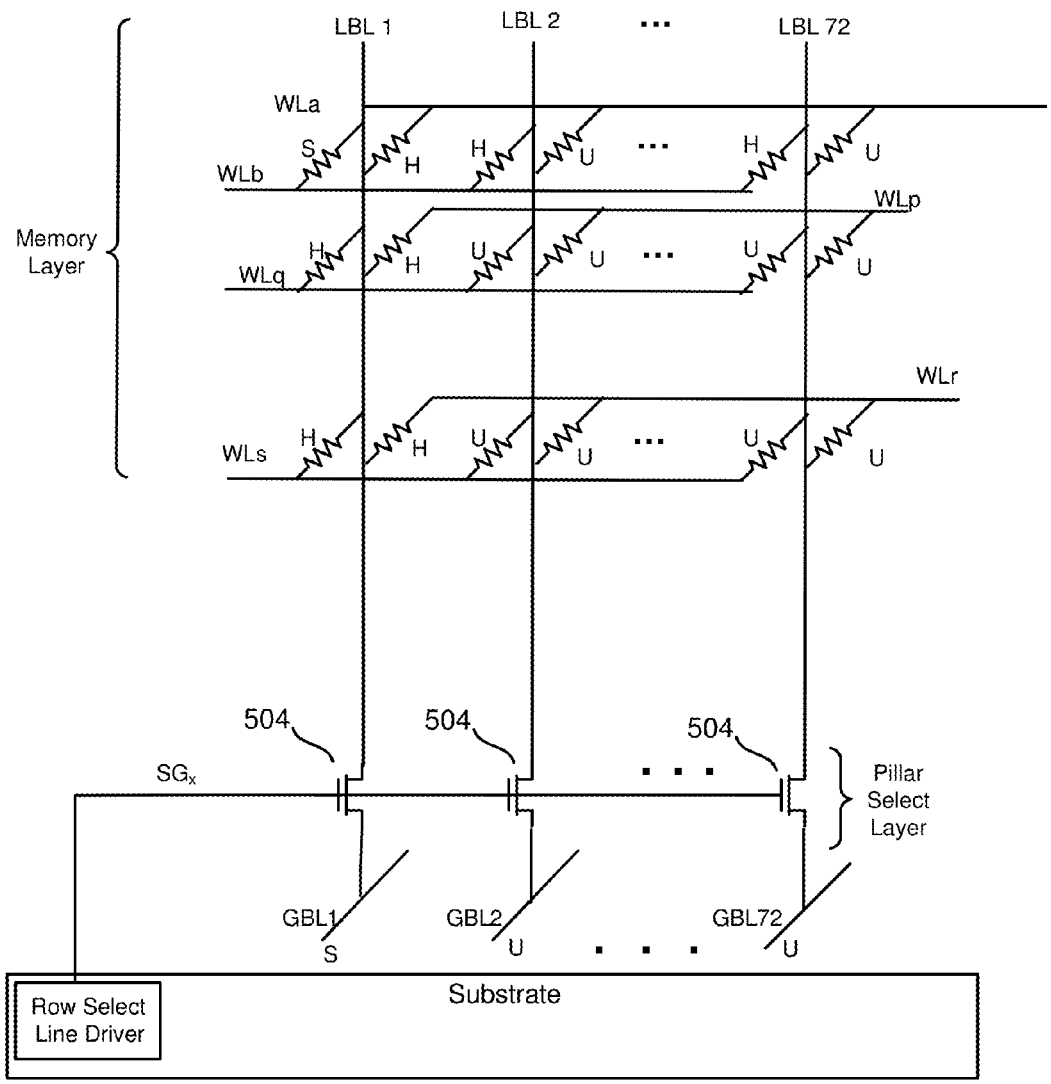
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, . . . LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, . . . GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_X$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
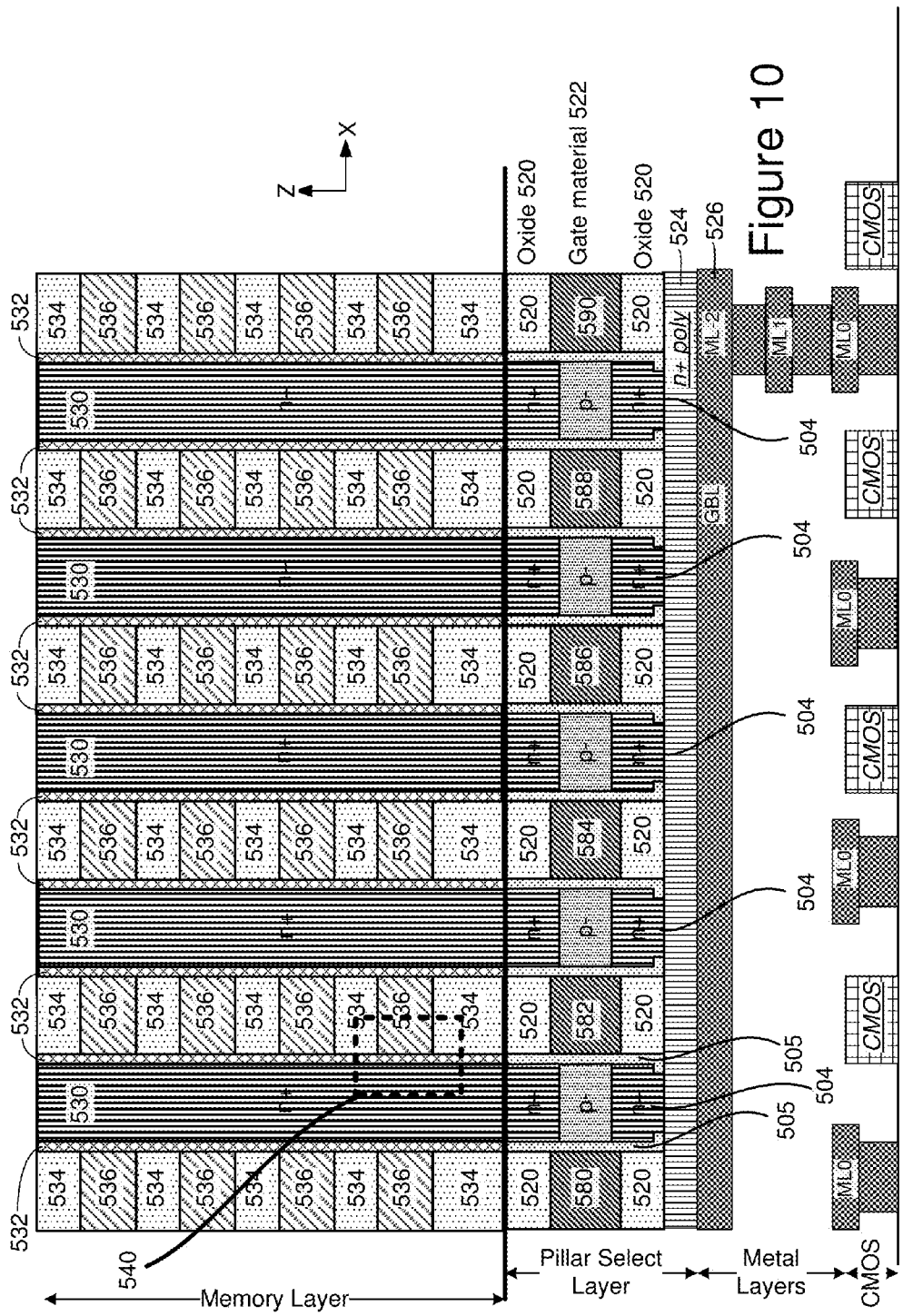
FIG. 10 illustrates one embodiment of a memory structure with vertical local bit lines above the substrate and vertically oriented select devices above the substrate that connect the bit lines to global bit lines.

FIG. 10 is a cross-sectional view of a memory structure using the vertically oriented select device discussed above and the memory structure of FIG. 6. As described below, the memory structure of FIG. 10 is a continuous mesh array of memory elements because there are memory elements connected to both sides of the bit lines and memory elements connected to both sides of the word lines. At the bottom of FIG. 10, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 10 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10 shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

Figure 11:
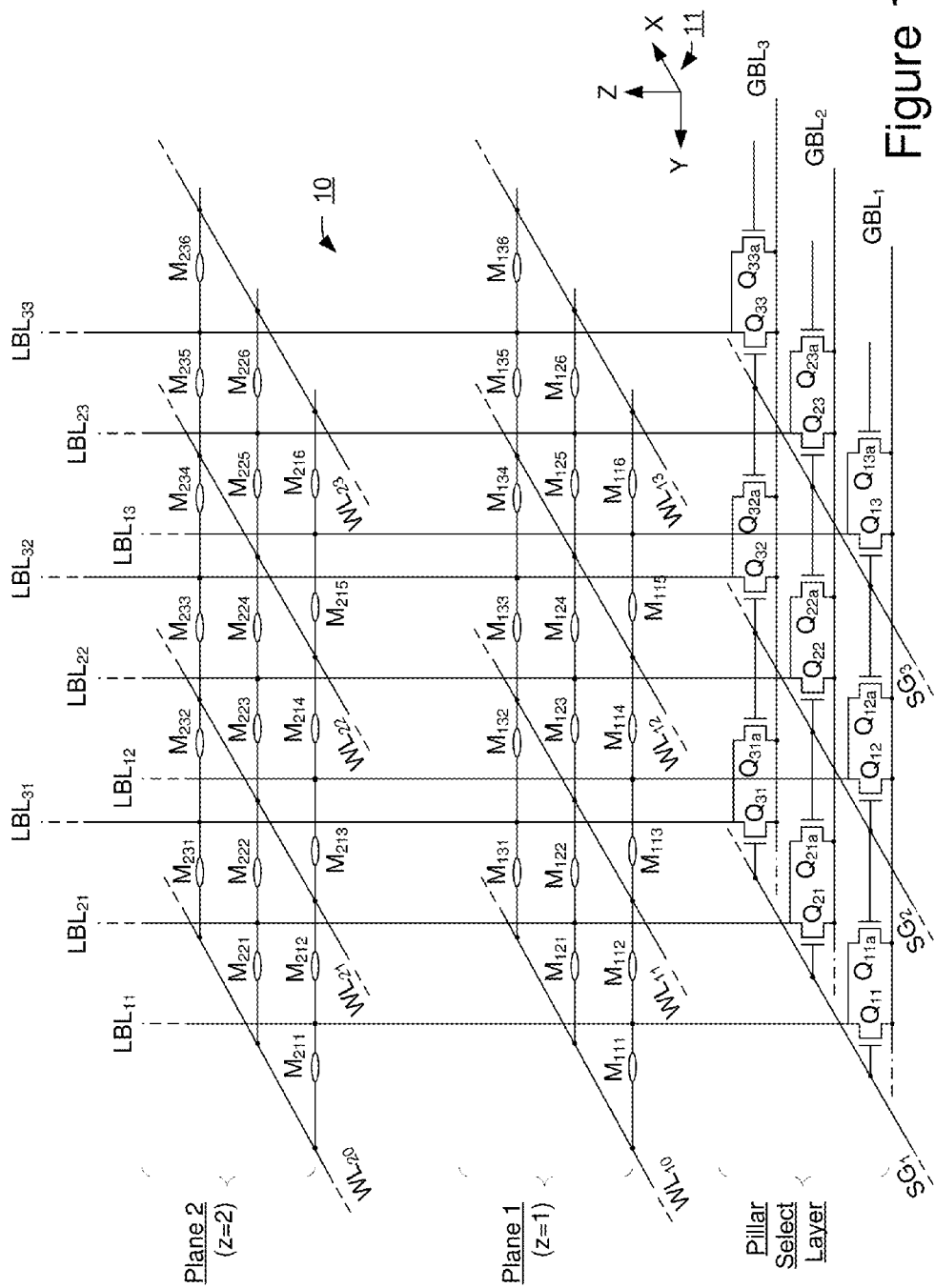
FIG. 11 is a schematic of a portion of the memory system, depicting vertical bit lines and vertically oriented select devices above the substrate.

FIG. 11 is a partial schematic of the memory system of FIG. 10 depicting the above-described double-gated structure for the vertically oriented select devices 504. Planes 1 and 2 of FIG. 11 are the same as in FIG. 1. As can be seen, each local bit line LBL is connectable to a respective global bit line GBL by two row select signals. FIG. 11 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 11.

Figure 12:
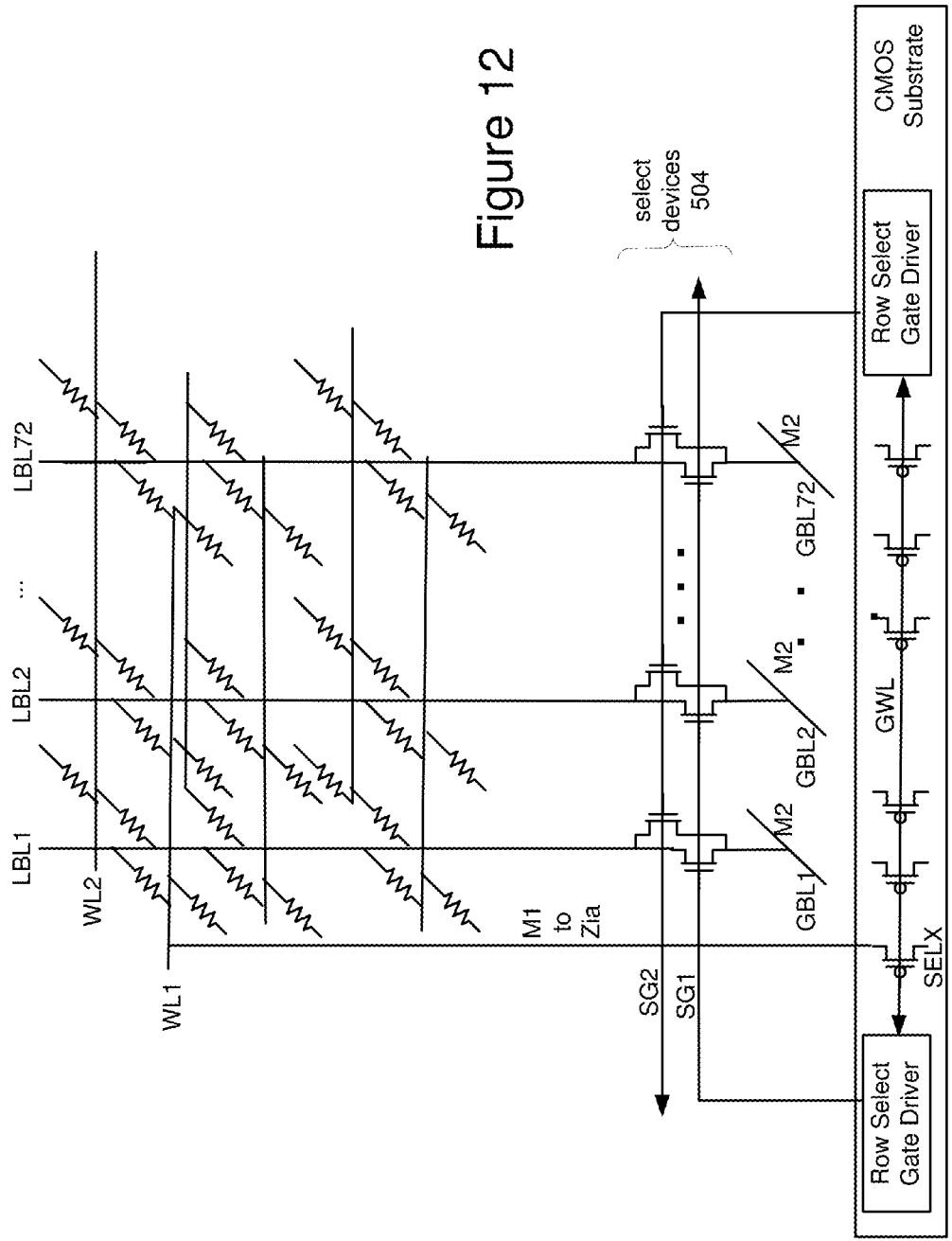
FIG. 12 is a schematic of a portion of the memory system, depicting vertical bit lines, vertically oriented select devices above the substrate and row select line drivers in the substrate.

FIG. 12 shows another partial schematic also depicting the double-gated structure such that each local bit line (LBL1, LBL2, . . . LBL72) are connected to their respective global bit lines (GBL1, GBL2, . . . GBL72) by any of two respective vertically oriented select devices that are positioned above the CMOS substrate. As can be seen, while the double-gated structure of FIG. 10 includes positioning the various select devices 504 above the substrate, the Row Select Line Drivers providing the row select lines $SG_1$, $SG_2$, . . . are positioned in the substrate. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

In prior designs, word line drivers were implemented in the substrate but outside the memory array (rather than underneath the memory array). To make the integrated circuit smaller, it is preferable to implement the word line drivers underneath the memory array. In some cases, a word line driver is as big in size as 16 word lines aggregated. Thus, the word line drivers have been too big to fit underneath the memory array. One proposed solution is to connect one word line driver to a group of multiple word lines connected together, where a memory system will have many of such groups. In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers need. Therefore, the word line drivers can fit underneath the memory array. The use of the vertically oriented select devices described above also provides more room underneath the memory array (e.g., in the substrate) in order to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturb for unselected memory elements.

Figure 13:
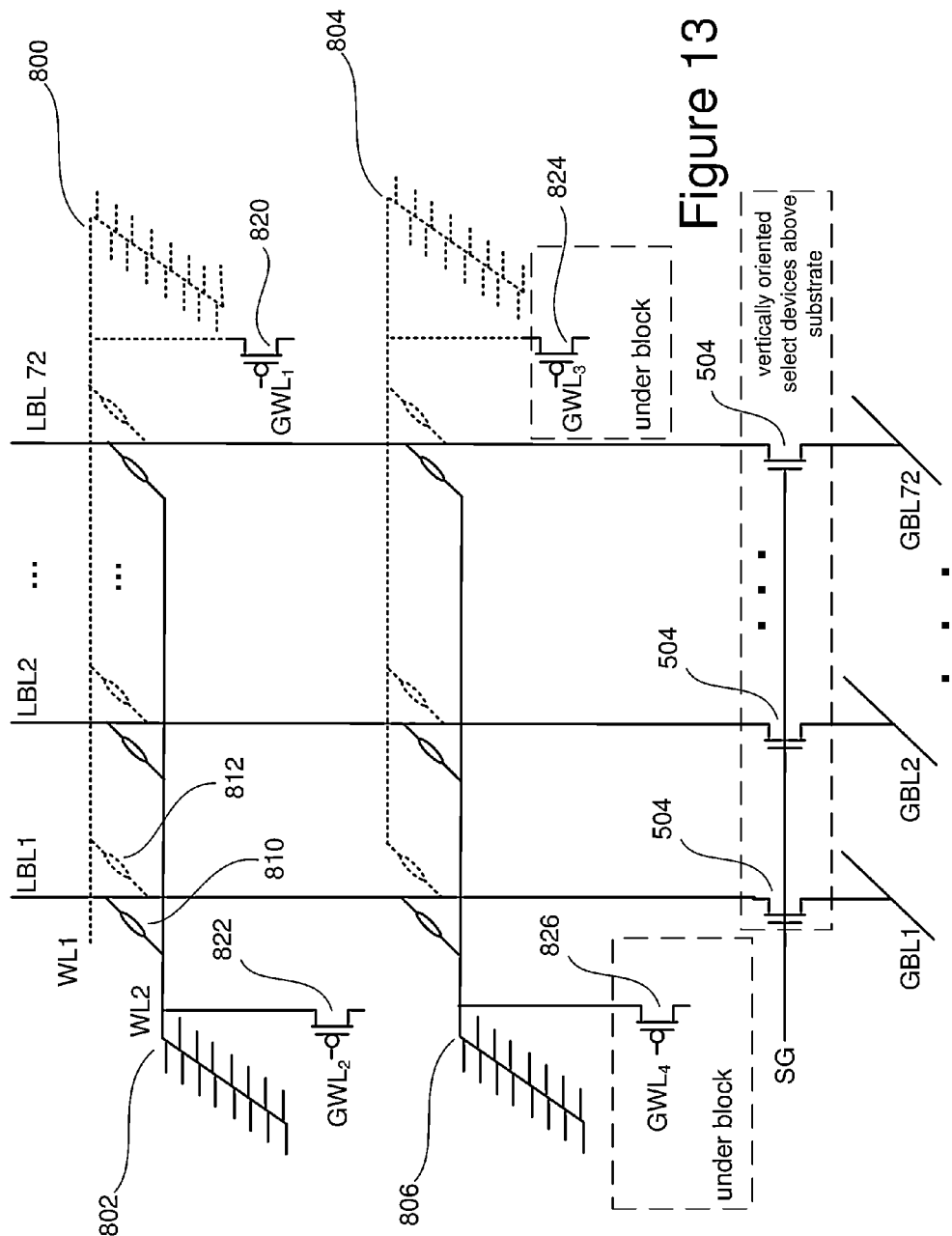
FIG. 13 is a schematic of a portion of the memory system, depicting vertical bit lines, vertically oriented select devices above the substrate and word line combs (connected word lines).

FIG. 13 is a partial schematic depicting a portion of a memory system which uses the comb structure described above. For example, FIG. 13 shows combs 800, 802, 804 and 806. A memory system is likely to have many more combs than depicted in FIG. 13; however, FIG. 13 will only show four combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block. FIG. 13 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal). Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) for which it is connected to.

FIG. 13 shows that word line comb 800 includes word line WL1 which is connected to memory elements that are in turn connected to local bit lines LB1, LB2, . . . LB72 (72 local bit lines). Word line comb 802 includes word line WL2 that is also connected to memory elements for the same 72 local bit lines LBL1, LBL2, . . . LBL72. In this arrangement, word line comb 800 is on one side of the memory array and word line comb 802 is on the opposite side of the memory array such that the word line fingers from comb 800 are interleaved with the word line fingers of word line comb 802. To make it easier to read, FIG. 13 is created such that word line combs 800, 804, and their word line fingers appear as dotted lines to show that they are from the right side of the memory array while combs 802, 806 are solid lines to show that they are from the left side of the memory array. In this arrangement, each memory element connected to a word line of word line comb 802 for the block being depicted will have a corresponding memory element connected to a word line for word comb 800 that connects to the same local bit line. For example, memory element 810 (connected to WL2) and memory element 812 (connected to WL1) are both connected to LBL1. Therefore, the system has to be operated such that if LBL1 is selected, only appropriate memory element 810 or 812 should be selected. Note that the local bit lines are connected to the appropriate global bit lines by the vertically oriented select devices 504 (described above) that are above the substrate. In other embodiments, the word line comb structure can be used without using the vertically oriented select devices. For example, the word line comb structures can be used with select devices that are implemented in the substrate.

Figure 14:
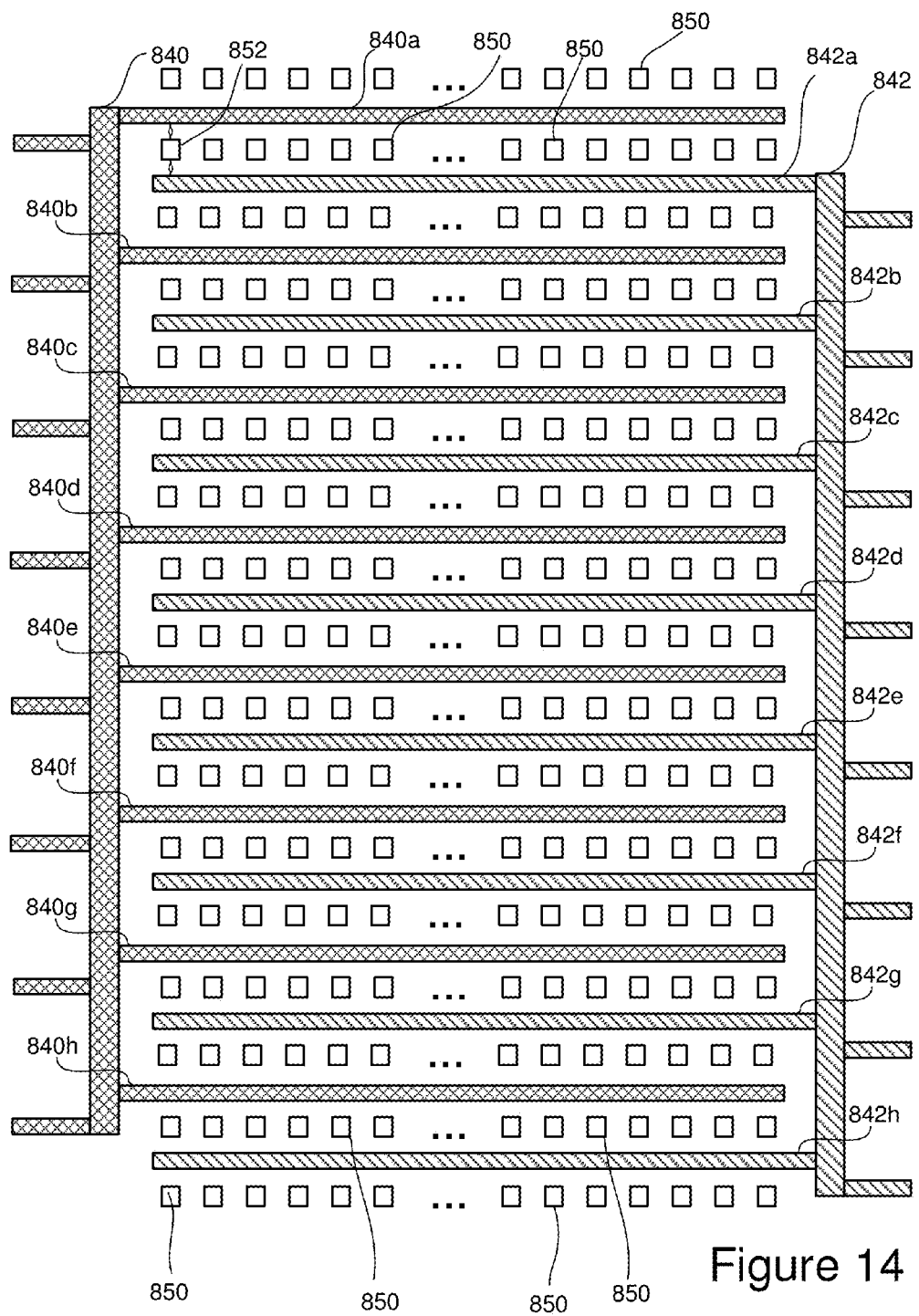
FIG. 14 is a top view of two word line combs and multiple vertical bit lines.

FIG. 14 is a top view of one layer of the memory array depicting part of two word line combs 840 and 842. As described above, each word line comb has word line fingers on two sides of its spine. FIG. 14 only shows the word line fingers on one side of each spine (with stubs being depicted for the word line fingers on the other side of the spine). For example, word line comb 840 includes word line fingers 840a, 840b, 840c, 840d, 840e, 840f, 840g and 840h. Word line comb 842 includes word line fingers 842a, 842b, 842c, 842d, 842e, 842f, 842g and 842h. Between adjacent word line fingers from word line combs 840 and 842 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory element. To make the drawing easy to read, memory elements are only depicted for local bit line 852.

Because two word line comb structures are interleaved and share local bit lines, biasing memory elements connected to one of the word line combs (and not the other) will have an effect on the other word line comb. Biasing the vertical bit lines will have an effect on all memory element (for any word line comb) connected to those bit lines, even though the respective word line combs are not biased. Biasing a word line comb will bias all 16 (or other number of) word line fingers that are part of that word line comb. However, it is typically desired to only program or read from memory elements connected to one word line finger of the comb.

FIG. 15A is a flow chart describing one embodiment for programming memory elements. The process of FIG. 15A can be performed as part of a SET process or as part of a RESET process. In Step 850, all word lines are driven to a common signal of ½ VPP. In general ½ Vpp represents the intermediate unselected word line voltage and is not necessarily exactly half the programming voltage Vpp. Due to IR drops and other particulars of each embodiment the intermediate unselected biases can be adjusted higher or lower than half the programming voltage and may range from ¼ to ¾ of the Vpp. In one embodiment, VPP is the largest voltage used on the integrated circuit for the memory array. One example of VPP is 4 volts; however, other values can also be used. In step 852, the local bit lines are all floated; therefore, they will drift to or near ½VPP. In step 854, ½VPP (e.g., an unselected voltage) is applied to all global bit lines. In step 856, one or more data dependent signals are applied to the global bit lines; for example, VPP is applied to only the selected global bit lines. In step 858, the vertically oriented select devices discussed above are turned on in order to connect the selected local bit lines to the selected global bit lines. In step 860, selected local bit lines will rise to or toward VPP. In step 862, the selected word line comb is pulled down to ground. In some embodiments more than one word line comb can be pulled down to ground. In other embodiments, only one word line comb can be selected at a time.

FIG. 15B is a flow chart describing other embodiments for programming memory elements. The process of FIG. 15B is similar to the process of FIG. 15A, except that the voltage differential experienced by the programmed memory elements has a reverse polarity. Therefore, if the process of FIG. 15A is used to SET the memory element, then the process of 15B can be can be used to RESET the memory element. Similarly, if the process of FIG. 15A is used to RESET the memory element then the process of FIG. 15B can be used to SET the memory element. In step 870 of FIG. 15B, all word lines are driven to a common signal of ½VPP. In step 872, all local bit lines are floated and they will therefore drift to at or near ½VPP. In step 874, ½VPP is applied to the all global bit lines. In step 876, one or more data dependent signals are applied to the global bit lines; for example, the selected global bit lines are pulled down to ground. In step 878, the vertically oriented select devices are turned on to connect the selected local bit lines to the selected global bit lines. In step 880, the selected local bit lines are pulled down to or toward ground in response to being connected to the global bit lines. At step 882, VPP is then applied to the selected word line comb (or multiple word line combs in some embodiments) in order to create the appropriate differential to cause the programming operation to be performed.

Figure 16:
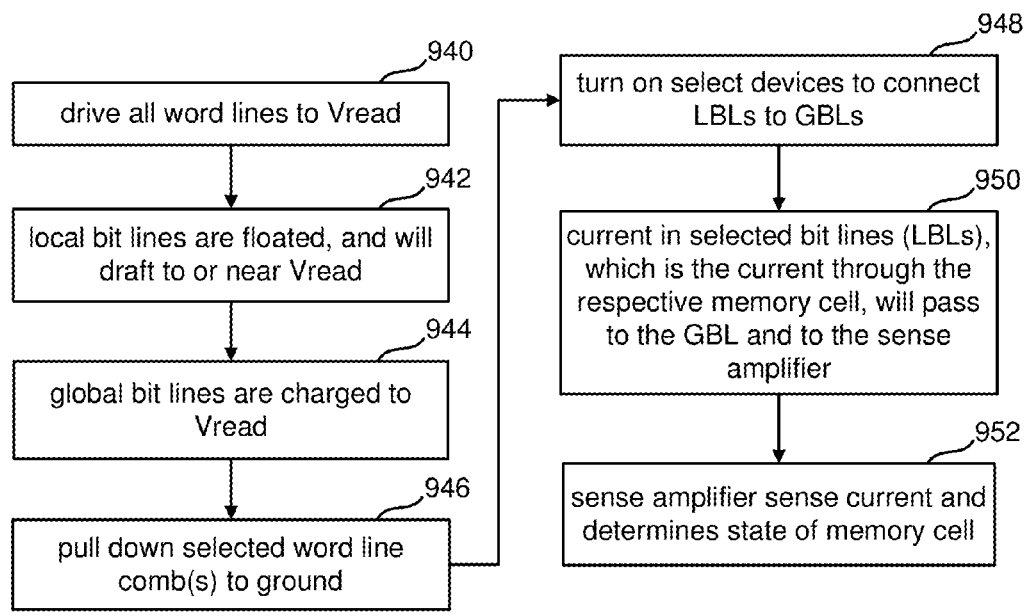
FIG. 16 is a flow chart describing one embodiment for reading the memory system.

FIG. 16 is a flow chart describing one embodiment of a process for reading memory elements. In step 940, all word lines are driven to a read voltage of Vread. In one embodiment, Vread is equal to 2 volts; however, other values can also be used, such as 1V or 0.7V. In step 942, the local bit lines are floated; therefore, they will drift to or near Vread. Some floating local bit lines will drift to a voltage just under Vread if they are connected to a memory element in the low resistance state. In step 944, the global bit lines are charged to one or more signals; for example, the global bit lines may be charged to Vread. In step 946, the selected word line comb (or in some embodiments multiple word line combs) are pulled down to ground. In step 948, the appropriate vertically oriented select devices are turned on in order to connect the appropriate selected local bit lines to the selected global bit lines. In this case, if a global bit line has been set to Vread, then a selected local bit line electrically connected to the global bit line via a bit line select device will be driven to Vread. In step 950, current through the selected memory element flows through the selected bit line, through the bit line select device (e.g., a vertical select device), through the associated global bit line, through a current conveyor clamp device, and ultimately from a sense node in the associated sense amplifier. In step 952, the sense amplifier will sense the current and determine the state of the memory element.

In some cases, a memory die may include a plurality of stripes (e.g., 8 or 16 stripes) and each of the stripes may include numerous word line combs. In one example, the number of word line combs in a stripe may comprise 1536 by 400 combs (0.614 million word line combs) per layer with 16 layers (9.83 million word line combs per stripe). If the number of stripes per memory die is 16, then the total number of word line combs (and corresponding word line drivers) would be 157.3 million.

In some cases, the non-volatile storage elements within a memory array, including a cross-point memory array with vertical bit lines, such as the memory array depicted in FIG. 1, may undergo a forming operation subsequent to the manufacturing of the memory array die, but prior to shipping of the memory array die (or products including the memory array die) to customers or prior to any programming operations being performed to the non-volatile storage elements. In one example, the forming operation (e.g., including the application of a forming voltage to the non-volatile storage elements) may be applied to the non-volatile storage elements during testing of a memory die prior to any programming operations being performed to the non-volatile storage elements. In another example, a forming operation must be applied to a non-volatile storage element prior to performing a programming or erase operation on the non-volatile storage element.

In some embodiments, a plurality of forming operations may be performed in which non-volatile storage elements located near the far ends of a plurality of word line fingers are formed prior to forming other non-volatile storage elements. In one example, non-volatile storage elements may be formed in each of the plurality of word line fingers in parallel and in an order that forms non-volatile storage elements in each of the plurality of word line fingers that are located near the far ends of the plurality of word line fingers before forming other non-volatile storage elements. In some cases, each non-volatile storage element of the non-volatile storage elements in each of the plurality of word line fingers that are formed during a particular forming operation may be current limited (e.g., to 2 μA) while a forming voltage (e.g., 4V) is applied across the non-volatile storage element. In one example, current limiting of a non-volatile storage element during a forming operation may be performed by a vertical TFT connected in series with a vertical bit line connected to the non-volatile storage element. In some cases, after a first forming operation of the plurality of forming operations has been performed, the non-volatile storage elements formed during the first forming operation may be reset from a lower resistance state into a higher resistance state prior to performing a second forming operation of the plurality of forming operations.

Figure 17A:
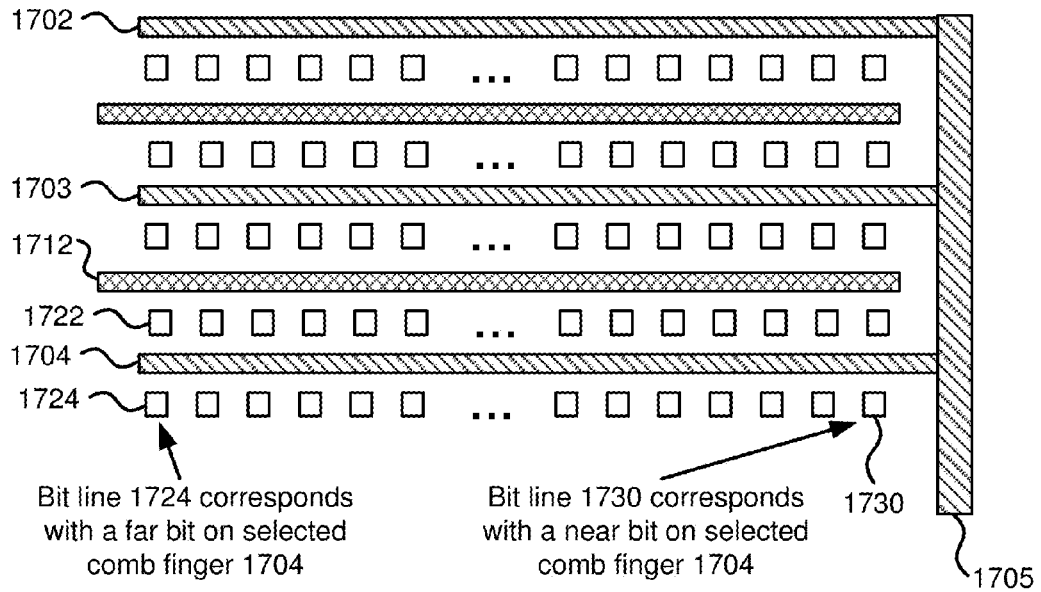
FIGS. 17A-17D depict one embodiment of a process for forming non-volatile storage elements.

FIGS. 17A-17D depict one embodiment of a process for forming non-volatile storage elements. A top down plan view of a portion of a word line comb is shown including a plurality of word line fingers and a plurality of vertical bit lines (e.g., bit lines 1722, 1724, and 1730). The vertical bit lines are arranged orthogonal to the plurality of word line fingers and would extend into the page. FIG. 17A depicts one embodiment of a portion of a word line comb including a base 1705 and a plurality of word line fingers including word line fingers 1702-1704 connected to the base 1705. Word line finger 1712 corresponds with a finger from a different word line comb that is interdigitated with the portion of the word line comb. In one example, word line finger 1712 may correspond with a first word line comb, such as word line comb 840 in FIG. 14, and word line finger 1704 may correspond with a second word line comb, such as word line comb 842 and FIG. 14.

Figure 17B:
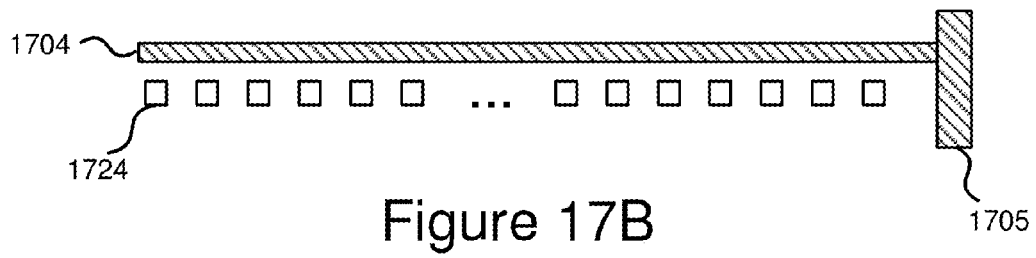
Figure 17C:
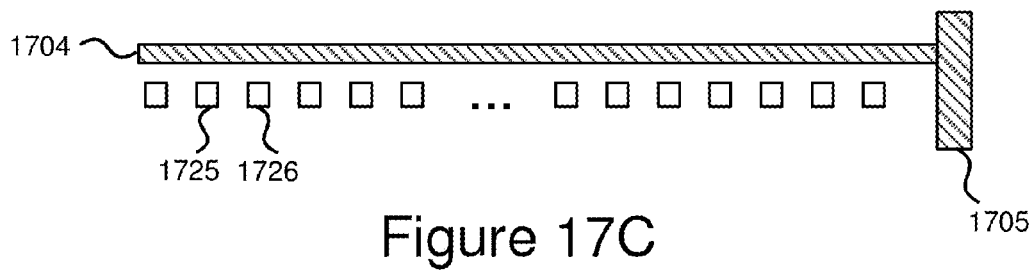
Figure 17D:
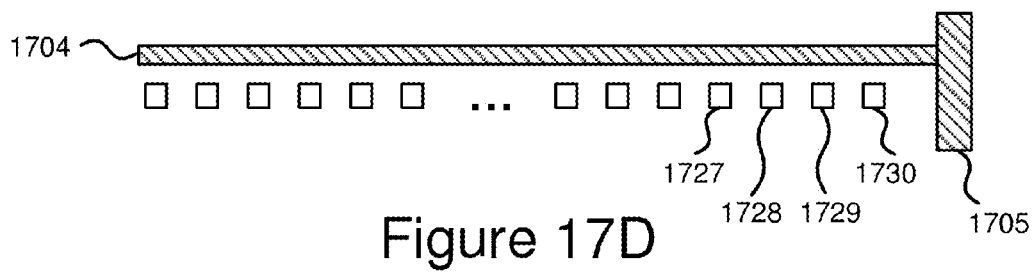

As depicted in FIG. 17A, the bit line 1724 corresponds with a far bit on the word line finger 1704 (i.e., a bit at the far end of the word line finger 1704 away from the base 1705) and the bit line 1730 corresponds with a near bit on the word line finger 1704 (i.e., a bit located closer to the base 1705). The vertical bit lines 1722 and 1724 corresponds with the farthest bits (or memory cells) connected to the word line finger 1704. The vertical bit line 1730 corresponds with that nearest bit (or memory cell) connected to the word line finger 1704. As depicted in FIG. 17B, during a first forming operation, a first forming voltage is applied across a non-volatile storage element connected to vertical bit line 1724 and word line finger 1704. As depicted in FIG. 17C, during a second forming operation subsequent to the first forming operation, a second forming voltage is applied across two non-volatile storage elements associated with vertical bit lines 1725-1726 and word line finger 1704. The second forming voltage may be the same as or different from the first forming voltage. In one example, the second forming voltage may be less than the first forming voltage. As depicted in FIG. 17D, during a third forming operation subsequent to the second forming operation, a third forming voltage is applied across four non-volatile storage elements associated with vertical bit lines 1727-

1730 and word line finger 1704. The third forming voltage may be the same as or different from the second forming voltage. In one example, the third forming voltage may be less than the second forming voltage.

In one embodiment, a first set of non-volatile storage elements (e.g., the non-volatile storage element associated with bit line 1724 and word line finger 1704) may be formed during a first forming operation, a second set of non-volatile storage elements (e.g., the non-volatile storage elements associated with bit lines 1725-1726 and word line finger 1704) may be formed during a second forming operation subsequent to the first forming operation, and a third set of non-volatile storage elements (e.g., the non-volatile storage elements associated with bit lines 1727-1730 and word line finger 1704) may be formed during a third forming operation subsequent to the second forming operation. Thus, the ordering of forming non-volatile storage elements may proceed from far bits (or the far ends of word line fingers) to near bits (or the near ends of word line fingers closest to the base of a word line comb) and the number of non-volatile storage elements formed during subsequent forming operations may be increased (e.g., due to the IR drop along a word line finger becoming less significant). In some cases, after one or more sets of non-volatile storage elements have been formed, a reset operation may be performed on the formed non-volatile storage elements in order to reduce the leakage currents through the already formed non-volatile storage elements. In one example, a reset operation may be performed after the first set of non-volatile storage elements and the second set of non-volatile storage elements connected to a particular word line finger have been formed, but prior to performing a third forming operation for forming a third set of non-volatile storage elements connected to the particular word line finger.

Figure 18A:
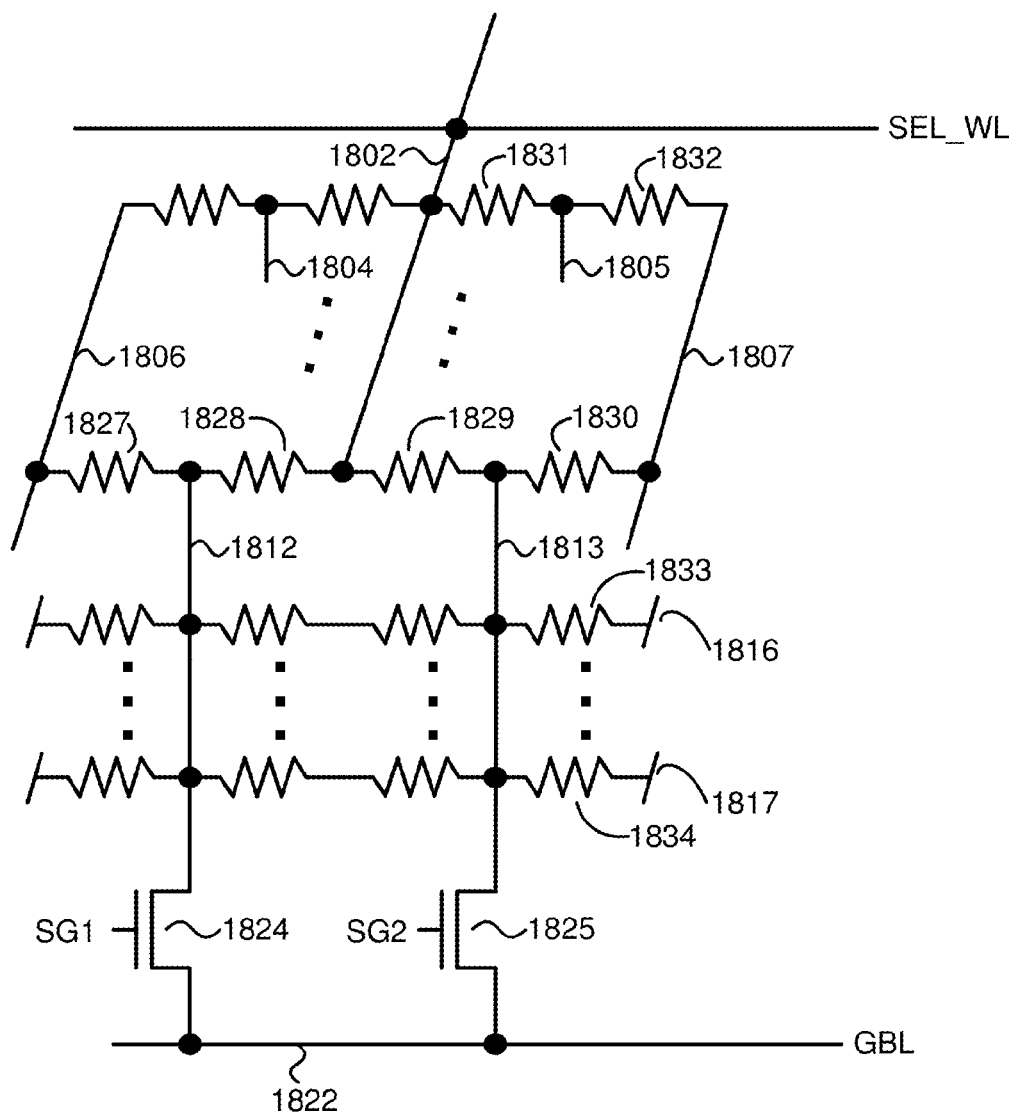
FIGS. 18A-18C depict various embodiments of a portion of a cross-point memory array including vertical bit lines.

FIG. 18A depicts one embodiment of a portion of a cross-point memory array including vertical bit lines. The cross-point memory array includes a portion of a word line comb that includes a first finger 1802 that is interdigitated with fingers 1806-1807 from a second word line comb. The first finger 1802 connects to a first vertical bit line 1812 via a non-volatile storage element 1828 and connects to a second vertical bit line 1813 via a non-volatile storage element 1829. The non-volatile storage element 1829 may correspond with the non-volatile storage element between bit line 1724 and word line finger 1704 in FIG. 17A. The first vertical bit line 1812 connects to finger 1806 of the second word line comb via a non-volatile storage element 1827. The second vertical bit line 1813 connects to finger 1807 of the second word line comb via a non-volatile storage element 1830. The first finger 1802 connects to an unselected vertical bit line 1805 via a non-volatile storage element 1831 and the finger 1807 of the second word line comb connects to the unselected vertical bit line 1805 via a non-volatile storage element 1832. The non-volatile storage element 1831 may correspond with the non-volatile storage element between bit line 1730 and word line finger 1704 in FIG. 17A. The second vertical bit line 1813 connects to a third finger 1816 associated with a third word line comb located below the word line comb associated with the first finger 1802 via a non-volatile storage element 1833. The second vertical bit line 1813 connects to a fourth finger 1817 associated with a fourth word line comb located below the word line comb associated with the first finger 1802 via a non-volatile storage element 1834. The second vertical bit line 1813 connects to a second transistor 1825 (e.g., a vertical TFT) and the first vertical bit line 1812 connects to a first transistor 1824. The second transistor 1825 and the first transistor 1824 connect to a global bit line 1822.

As depicted in FIG. 18A, a first finger 1802 of a portion of a word line comb (e.g., corresponding with the portion of the word line comb depicted in FIG. 17A that includes the word line fingers 1702-1704) has been set to a selected word line voltage (SEL_WL) and the global bit line 1822 has been set to a selected bit line voltage (GBL). The difference between the selected word line voltage and the selected bit line voltage may comprise a forming voltage for forming non-volatile storage elements that have been selected for forming during a forming operation.

Figure 18B:
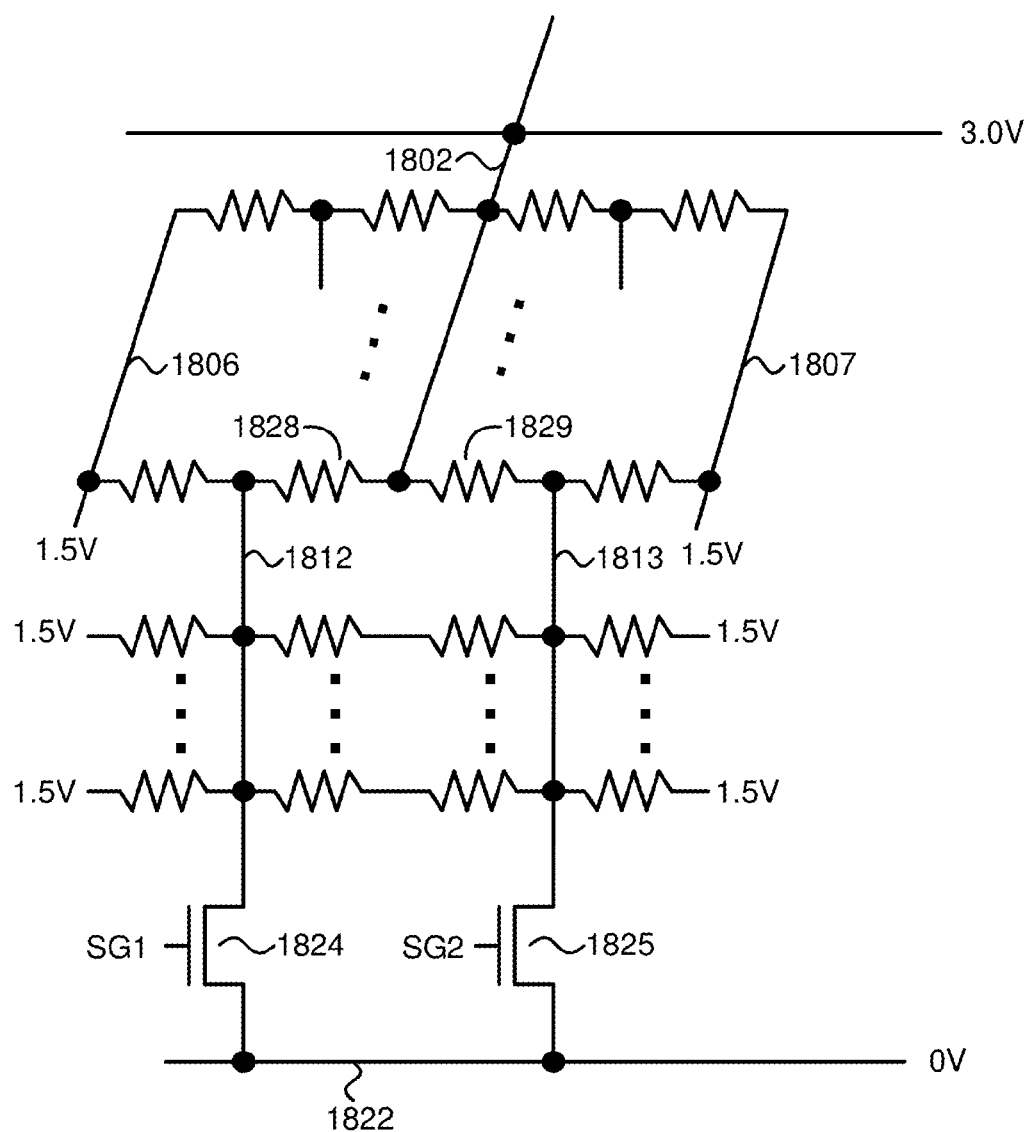

FIG. 18B depicts the portion of the cross-point memory array of FIG. 18A in which the word line comb associated with the first finger 1802 has been set to 3.0V and the global bit line 1822 has been set to 0V. In this case, the unselected word line combs located below the word line comb have been set to 1.5V and the second word line comb (i.e., the word line comb associated with fingers 1806-1807) has been set to 1.5V. If the transistor 1824 is placed into a conducting state, then the first vertical bit line 1812 may be electrically connected to the global bit line 1822 and pulled towards 0V. In some cases, the gate connection (SG1) of transistor 1824 may be set such that transistor 1824 limits the amount of current drawn from the first vertical bit line 1812 and limits the current through the non-volatile storage element 1828 (e.g., to not exceed 1 µA). In some cases, the transistor 1825 may be placed into a non-conducting such that the second vertical bit line 1813 is not electrically connected to the global bit line or otherwise pulled towards 0V. If the transistor 1825 is placed into a conducting state, then the second vertical bit line 1813 may be electrically connected to the global bit line 1822 and pulled towards 0V. In some cases, the gate connection (SG2) of transistor 1825 may be set such that transistor 1825 limits the amount of current drawn from the second vertical bit line 1813 and limits the current through the non-volatile storage element 1829 (e.g., to not exceed 1 µA).

Figure 18C:
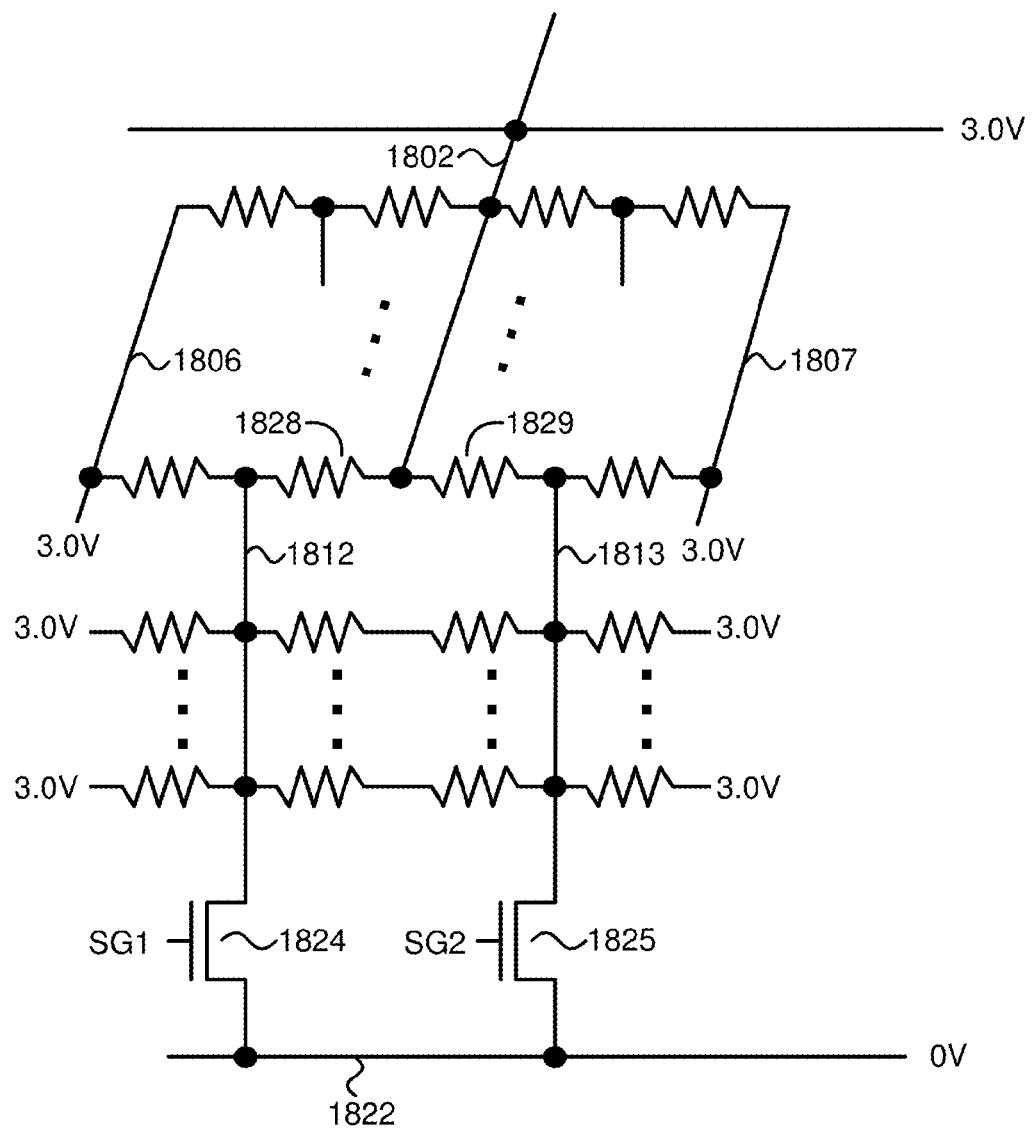

FIG. 18C depicts the portion of the cross-point memory array of FIG. 18A in which the word line comb associated with the first finger 1802 has been set to 3.0V and the global bit line 1822 has been set to 0V. In this case, the word line combs located below the word line comb have been set to 3.0V and the second word line comb (i.e., the word line comb associated with fingers 1806-1807) has been set to 3.0V. In one example, the number of word line comb layers below the word line comb associated with the first finger 1802 may comprise 7 layers (i.e., 8 total word line comb layers) or 15 layers (i.e., 16 total word line comb layers). In some cases, the gate connection (SG1) of transistor 1824 may be set such that transistor 1824 limits the total amount of current drawn from the first vertical bit line 1812 and limits the current through all of the non-volatile storage elements connected to the first vertical bit line 1812. In some cases, the gate connection (SG2) of transistor 1825 may be set such that transistor 1825 limits the total amount of current drawn from the second vertical bit line 1813 and limits the current through all of the non-volatile storage elements connected to the second vertical bit line 1813. As depicted, as the word line comb associated with the first finger 1802 and the word line combs located below the word line comb are all set to 3.0V, non-volatile storage elements located on all of the word line comb layers may be formed at the same time. However, the current drawn from a single non-volatile storage element connected to a vertical bit line may not be specifically limited as the current limiting transistor in series with the vertical bit line may only limit the total current drawn from the vertical bit line.

In some embodiments, a memory array may include a plurality of word line comb layers (e.g., 16 total word line comb layers) and a forming operation may be concurrently performed on non-volatile storage elements on all of the plurality of word line comb layers or a subset of the plurality of word line comb layers. In one example, the forming operation may be performed for one layer of the plurality of word line comb layers (e.g., the forming operation may be performed on the fifth layer out of 16 word line comb layers). In another example, the forming operation may be performed on a first plurality of the plurality of word line comb layers (e.g., the forming operation may be performed on four layers out of 16 word line comb layers). In this case, the forming operation for the first plurality of the plurality of word line comb layers may set the first plurality to 3.0V and the remaining layers of the plurality of word line comb layers to 1.5V (or another voltage that is less than a forming voltage necessary to form a non-volatile storage element). In another example, the forming operation may be performed on a first-half of the plurality of word line comb layers (e.g., the forming operation may be performed on the top eight layers out of 16 word line comb layers).

Figure 19A:
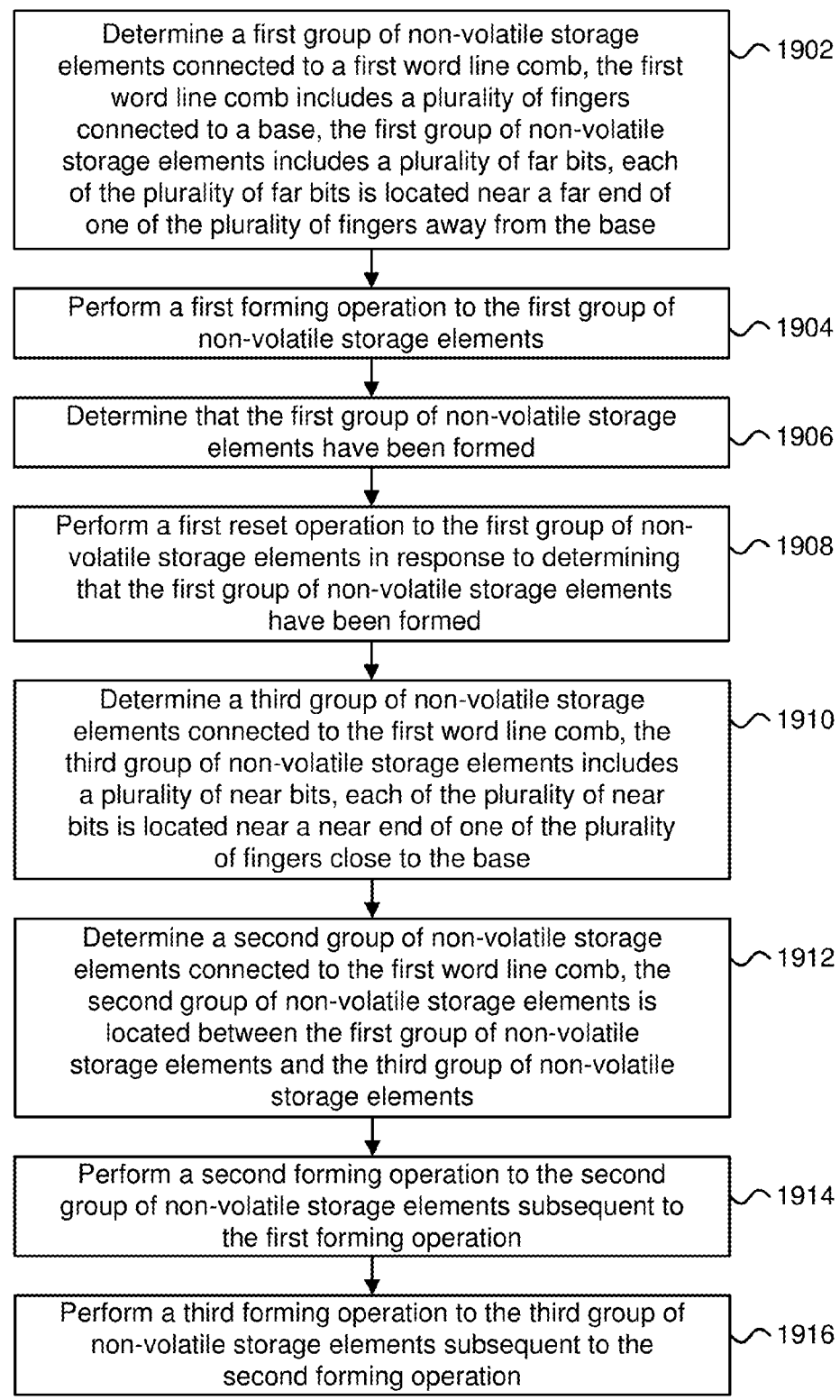
FIG. 19A is a flowchart describing one embodiment of a process for forming non-volatile storage elements.

FIG. 19A is a flowchart describing one embodiment of a process for forming non-volatile storage elements. In one embodiment, the process of FIG. 19A may be performed by a memory system or by a memory controller, such as controller 25 in FIG. 2.

In step 1902, a first group of non-volatile storage elements connected to a first word line comb is determined. The first word line comb may include a plurality of fingers connected to a base. The first group of non-volatile storage elements may include a plurality of far bits, each of the plurality of far bits may be located near a far end of one of the plurality of fingers away from the base. In one example, the first group of non-volatile storage elements may correspond with a plurality of farthest bits connected to the plurality of fingers. One of the farthest bits may correspond with the non-volatile storage element connected between vertical bit line 1724 and word line finger 1704 in FIG. 17A.

In step 1904, a first forming operation is performed to the first group of non-volatile storage elements. The first forming operation may include applying a first forming voltage (e.g., 3.0V) to the first group of non-volatile storage elements for a first period of time (e.g., 500 ns). The first forming operation may include limiting the current through each of the first group of non-volatile storage elements during the first period of time. Various embodiments of processes for performing a forming operation are described later in reference to FIGS. 19C-19D.

In step 1906, it is determined that the first group of non-volatile storage elements have been formed. In one embodiment, a sensing operation may be performed to test the resistance of each non-volatile storage element of the first group of non-volatile storage elements to determine whether each non-volatile storage element of the first group has been properly formed or has obtained a particular resistance value. In step 1908, a first reset operation is performed to the first group of non-volatile storage elements in response to determining that the first group of non-volatile storage elements have been formed. In one embodiment, the first reset operation causes each non-volatile storage element of the first group to be placed into a higher resistance state than the resistance state caused by the first forming operation.

In step 1910, a third group of non-volatile storage elements connected to the first word line comb is determined. The third group of non-volatile storage elements may include a plurality of near bits, each of the plurality of near bits may be located near a near end of one of the plurality of fingers close to the base. In one example, the third group of non-volatile storage elements may correspond with a plurality of nearest bits connected to the plurality of fingers. One of the nearest bits may correspond with the non-volatile storage element connected between vertical bit line 1730 and word line finger 1704 in FIG. 17A.

In step 1912, a second group of non-volatile storage elements connected to the first word line comb is determined. The second group of non-volatile storage elements may be located between the first group of non-volatile storage elements and the third group of non-volatile storage elements. In one example, the second group of non-volatile storage elements may correspond with the two non-volatile storage elements associated with vertical bit lines 1725-1726 and word line finger 1704 in FIG. 17A and the third group of non-volatile storage elements may correspond with the four non-volatile storage elements associated with vertical bit lines 1727-1730 and word line finger 1704 in FIG. 17A.

In step 1914, a second forming operation is performed to the second group of non-volatile storage elements subsequent to the first forming operation. In step 1916, a third forming operation is performed to the third group of non-volatile storage elements subsequent to the second forming operation. In some cases, a second reset operation may be performed to the second group of non-volatile storage elements prior to performing the third forming operation to the third group of non-volatile storage elements. In one embodiment, the number of non-volatile storage elements in the first group may be the same as the number of non-volatile storage elements in the second group (e.g., 16 total non-volatile storage elements over 16 fingers or 32 total non-volatile storage elements over 16 fingers). In another embodiment, the first group of non-volatile storage elements may comprise a first number of non-volatile storage elements (e.g., 16 total non-volatile storage elements) and the second group of non-volatile storage elements may comprise a second number greater than the first number (e.g., 64 total non-volatile storage elements).

In some embodiments, a second reset operation may be performed to the second group of non-volatile storage elements in response to determining that the second group of non-volatile storage elements have been formed. The second reset operation may cause each non-volatile storage element of the second group to be placed into a higher resistance state than the resistance state caused by the second forming operation. In some cases, the first group of non-volatile storage elements may be formed, verified, and reset before the second group of non-volatile storage elements are formed. In other cases, the third group of non-volatile storage elements may be formed, verified, and reset before the second group of non-volatile storage elements are formed. Moreover, after the second group of non-volatile storage elements have been formed, the second group may be reset.

Figure 19B:
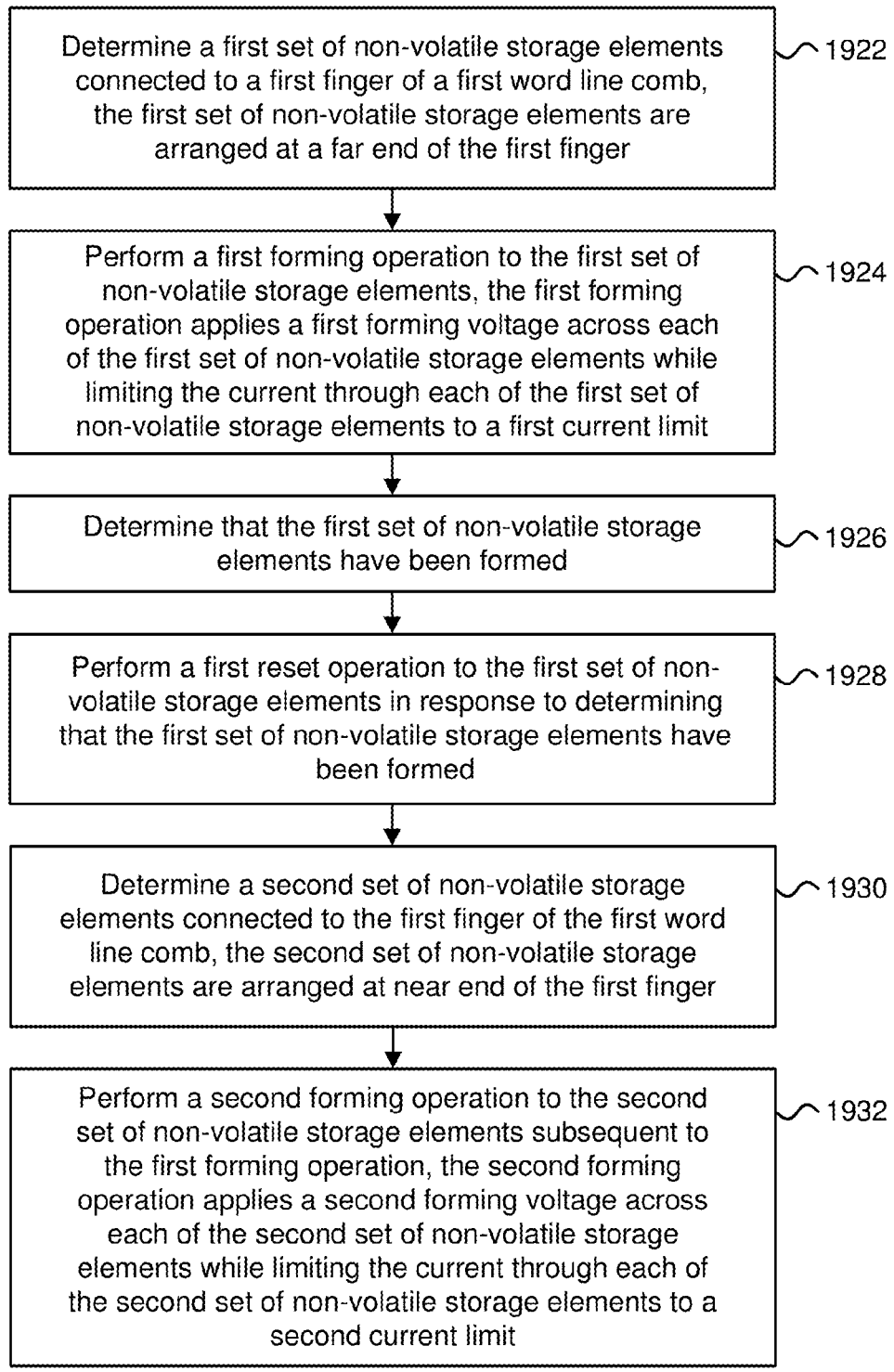
FIG. 19B is a flowchart describing an alternative embodiment of a process for forming non-volatile storage elements.

FIG. 19B is a flowchart describing an alternative embodiment of a process for forming non-volatile storage elements. In one embodiment, the process of FIG. 19B may be performed by a memory system or by a memory controller, such as controller 25 in FIG. 2.

In step 1922, a first set of non-volatile storage elements connected to a first finger of a first word line comb is determined. The first set of non-volatile storage elements may be arranged at a far end of the first finger. In step 1924, a first forming operation is performed to the first set of non-volatile storage elements. The first forming operation may apply a first forming voltage (e.g., 3V) across each of the first set of non-volatile storage elements while limiting the current through each of the first set of non-volatile storage elements to a first current limit (e.g., to 1 μA). Various embodiments of processes for performing a forming operation with current limiting are described later in reference to FIGS. 19C-19D.

In step 1926, it is determined that the first set of non-volatile storage elements have been formed. In one embodiment, a sensing operation may be performed to test the resistance of each non-volatile storage element of the first group of non-volatile storage elements to determine whether each non-volatile storage element of the first group has been properly formed or has obtained a particular resistance value. In step 1928, a first reset operation is performed to the first set of non-volatile storage elements in response to determining that the first set of non-volatile storage elements have been formed. In one embodiment, the first reset operation causes each non-volatile storage element of the first set to be placed into a higher resistance state than the resistance state caused by previous forming operations.

In step 1930, a second set of non-volatile storage elements connected to the first finger of the first word line comb is determined. The second set of non-volatile storage elements may be arranged at a near end of the first finger. The second set of non-volatile storage elements may comprise a grouping of non-volatile storage elements that are closer to a base of the first word line comb then the first set of non-volatile storage elements. In step 1932, a second forming operation is performed to the second set of non-volatile storage elements subsequent to the first forming operation. The second forming operation applies a second forming voltage (e.g., 2.8V) across each of the second set of non-volatile storage elements while limiting the current through each of the second set of non-volatile storage elements to a second current limit (e.g., to 1.2 µA). In some cases, the second current limit may be the same as or different from the first current limit and the second forming voltage may be the same as or different from the first forming voltage. In one example, the second forming voltage may be less than the first forming voltage and the second current limit may be the same as the first current limit. In another example, the second forming voltage may be equal to the first forming voltage and the second current limit may be the greater as the first current limit.

Figure 19C:
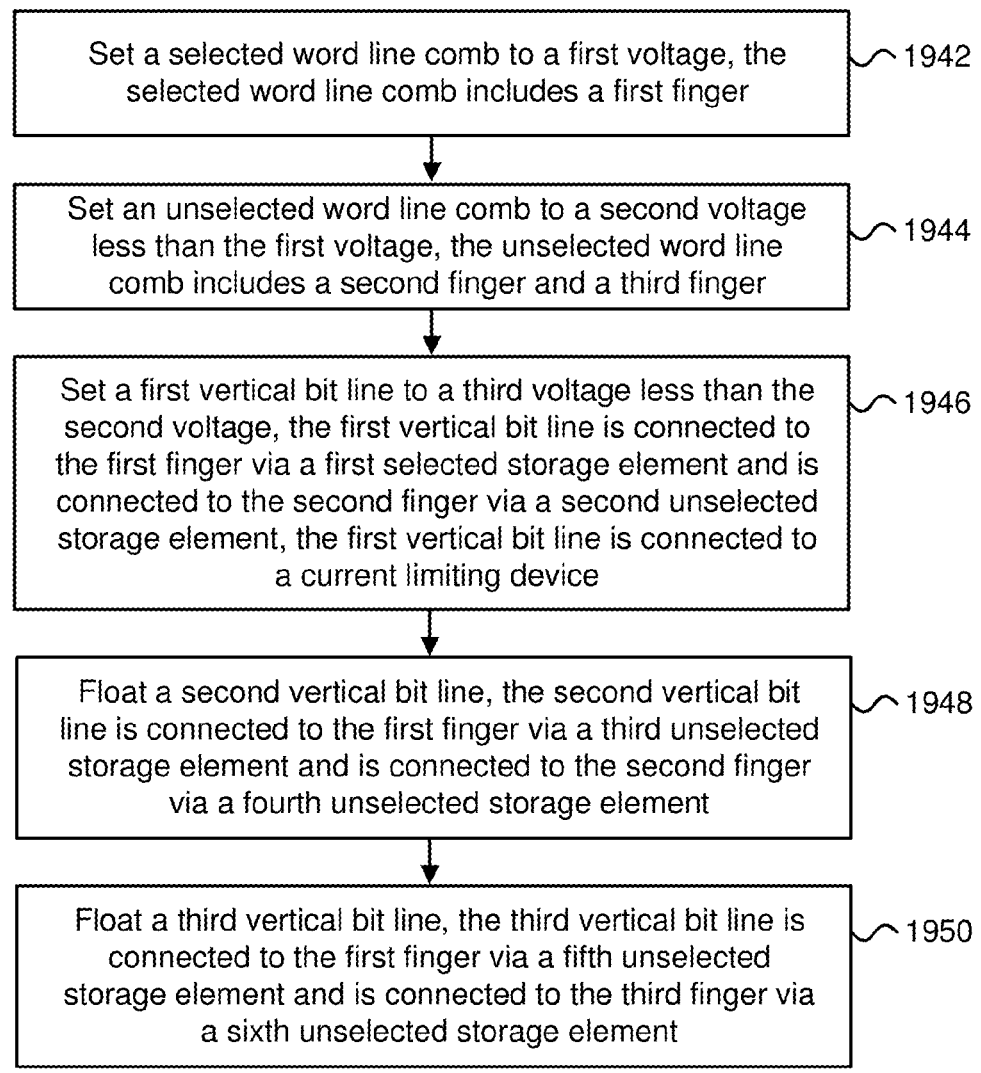
FIG. 19C is a flowchart describing one embodiment of a process for performing a forming operation.

FIG. 19C is a flowchart describing one embodiment of a process for performing a forming operation. The process described in FIG. 19C is one example of a process for implementing step 1904 in FIG. 19A or for implementing step 1924 in FIG. 19B. In one embodiment, the process of FIG. 19C may be performed by a memory system or by a memory controller, such as controller 25 in FIG. 2.

In step 1942, a selected word line comb is set to a first voltage. The selected word line comb may include a first finger. The first finger may be one of a plurality of fingers associated with the selected word line comb. In one example, the first finger may correspond with finger 1802 in FIG. 18A. In step 1944, an unselected word line comb is set to a second voltage less than the first voltage. The unselected word line comb may include a second finger and a third finger. In one example, the second finger may correspond with finger 1807 in FIG. 18A and the third finger may correspond with finger 1806 in FIG. 18A. In one embodiment, the first voltage may comprise 3.0V and the second voltage may comprise 1.5V. In some cases, the unselected word line comb may comprise a word line comb that is interdigitated with the selected word line comb on the same word line comb layer out of a plurality of word line comb layers. In some embodiments, the word line combs on other layers of the plurality of word line comb layers may also be set to the second voltage (e.g., 1.5V).

In step 1946, a first vertical bit line is set to a third voltage less than the second voltage. In one embodiment, the third voltage may comprise 0V or a voltage close to 0V. The first vertical bit line may be connected to the first finger via a first selected storage element and may be connected to the second finger via a second unselected storage element. In one example, the first vertical bit line may correspond with bit line 1812 in FIG. 18A. The first vertical bit line may be connected to a current limiting device, such as a vertical TFT. In step 1948, a second vertical bit line may be floated or not electrically connected to a first global bit line. The second vertical bit line may be connected to the first finger via a third unselected storage element and may be connected to the second finger via a fourth unselected storage element. In one example, the second vertical bit line may correspond with bit line 1804 in FIG. 18A. In step 1950, a third vertical bit line may be floated or not electrically connected to a second global bit line different from the first global bit line. The third vertical bit line may be connected to the first finger via a fifth unselected storage element and may be connected to the third finger via a sixth unselected storage element. In one example, the third vertical bit line may correspond with bit line 1813 in FIG. 18A.

Figure 19D:
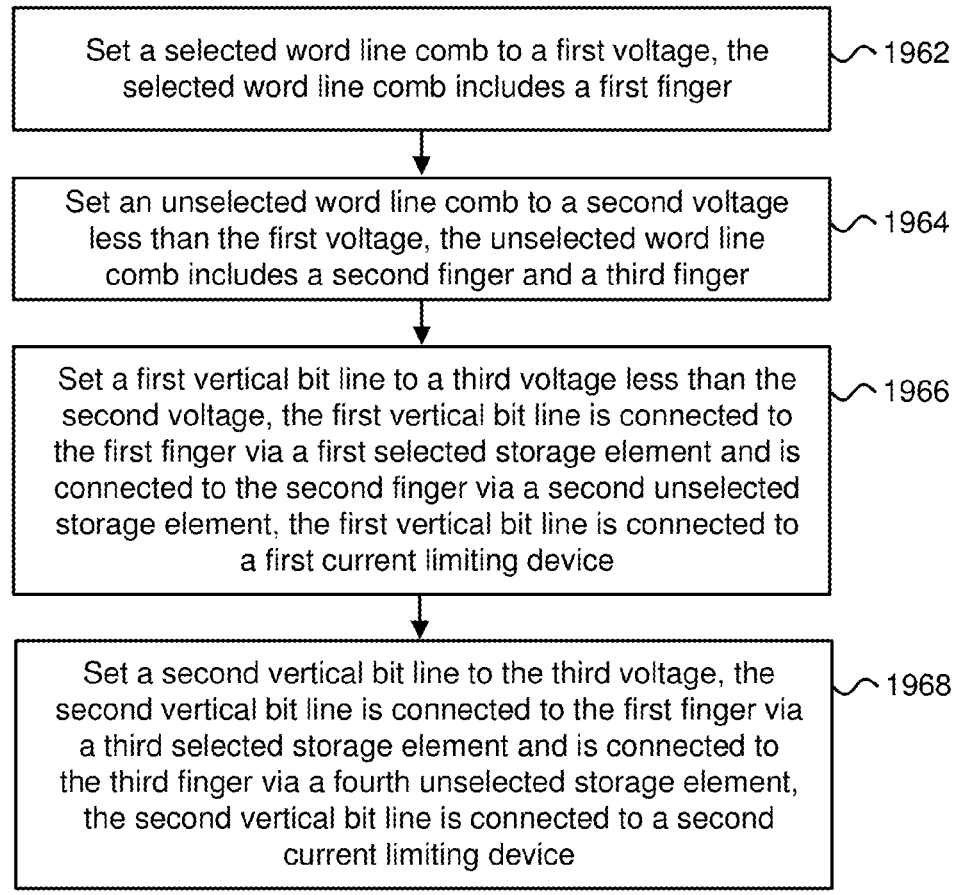
FIG. 19D is a flowchart describing an alternative embodiment of a process for performing a forming operation.

FIG. 19D is a flowchart describing an alternative embodiment of a process for performing a forming operation. The process described in FIG. 19D is one example of a process for implementing step 1904 in FIG. 19A or for implementing step 1924 in FIG. 19B. In one embodiment, the process of FIG. 19D may be performed by a memory system or by a memory controller, such as controller 25 in FIG. 2.

In step 1962, a selected word line comb is set to a first voltage. The selected word line comb may include a first finger. The first finger may be one of a plurality of fingers associated with the selected word line comb. In one example, the first finger may correspond with finger 1802 in FIG. 18A. In step 1964, an unselected word line comb is set to a second voltage less than the first voltage. The unselected word line comb may include a second finger and a third finger. In one example, the second finger may correspond with finger 1807 in FIG. 18A and the third finger may correspond with finger 1806 in FIG. 18A. In one embodiment, the first voltage may comprise 3.5V and the second voltage may comprise 2.5V. In some cases, the unselected word line comb may comprise a word line comb that is interdigitated with the selected word line comb on the same word line comb layer out of a plurality of word line comb layers. In some embodiments, the word line combs on other layers of the plurality of word line comb layers may also be set to the second voltage (e.g., 2.5V).

In step 1966, a first vertical bit line is set to a third voltage less than the second voltage. In one embodiment, the third voltage may comprise 0V or a voltage close to 0V. The first vertical bit line may be connected to the first finger via a first selected storage element and may be connected to the second finger via a second unselected storage element. In one example, the first vertical bit line may correspond with bit line 1812 in FIG. 18A. The first vertical bit line may be connected to a first current limiting device, such as transistor 1824 in FIG. 18A. In step 1968, a second vertical bit line is set to the third voltage. The second vertical bit line may be connected to the first finger via a third selected storage element and may be connected to the third finger via a fourth unselected storage element. In one example, the second vertical bit line may correspond with bit line 1813 in FIG. 18A. The second vertical bit line may be connected to a second current limiting device, such as transistor 1825 in FIG. 18A. In this case, both the first selected storage element and the third selected storage element may be formed at the same time (or concurrently) and both storage elements may be individually current limited during the forming operation.

Figure 20A:
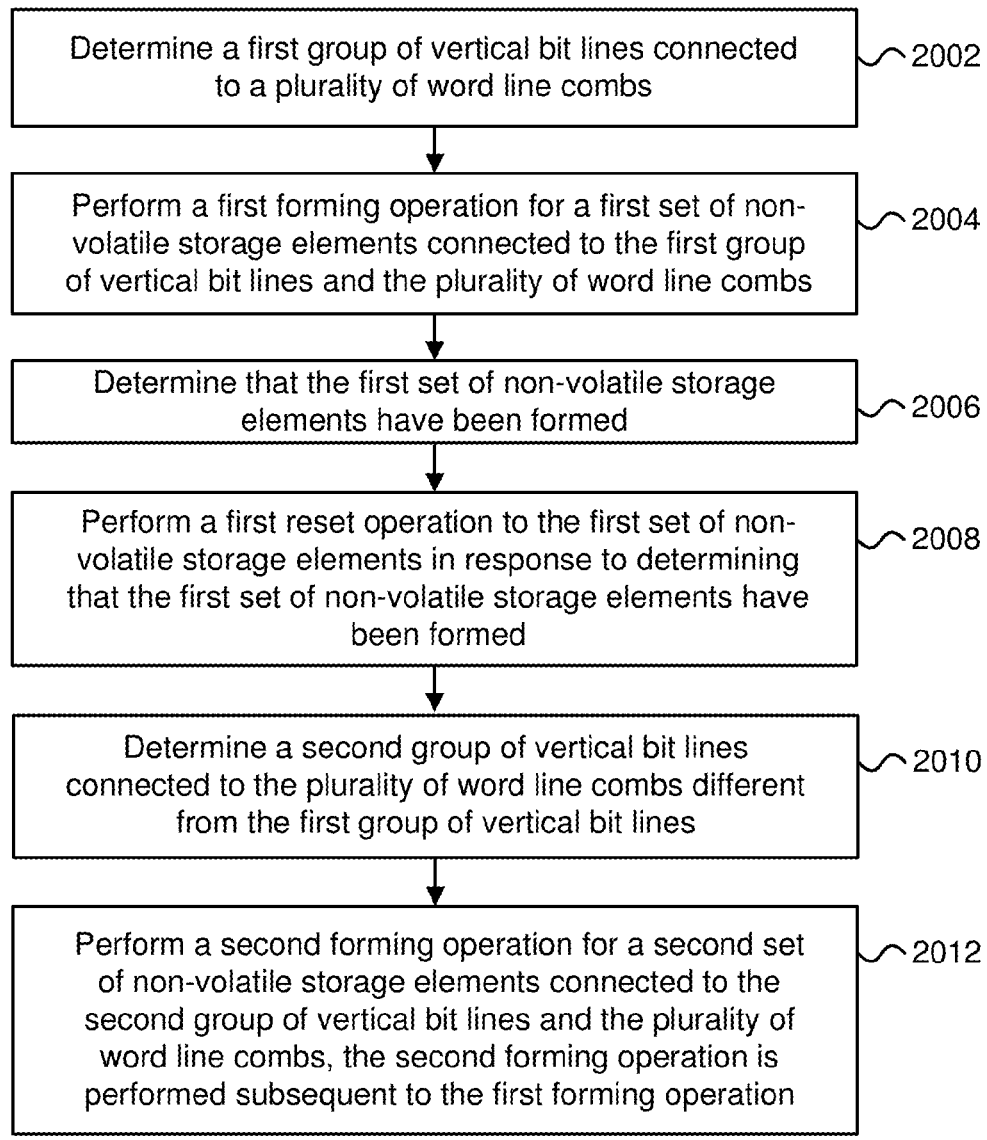
FIG. 20A is a flowchart describing another embodiment of a process for forming non-volatile storage elements.

FIG. 20A is a flowchart describing another embodiment of a process for forming non-volatile storage elements. In one embodiment, the process of FIG. 20A may be performed by a memory system or by a memory controller, such as controller 25 in FIG. 2.

In step 2002, a first group of vertical bit lines connected to a plurality of word line combs is determined. In one example, the first group of vertical bit lines may include a first bit line corresponding with bit line 1813 in FIG. 18A. The plurality of word line combs may correspond with a plurality of fingers connected to the first bit line, wherein each finger of the plurality of fingers is located at a different layer within a plurality of word line comb layers. In one example, a first finger of the plurality of fingers may correspond with finger 1816 in FIG. 18A, a second finger of the plurality of fingers may correspond with finger 1817 in FIG. 18A, and a third finger of the plurality of fingers may correspond with finger 1807 in FIG. 18A.

In step 2004, a first forming operation is performed for a first set of non-volatile storage elements connected to the first group of vertical bit lines and the plurality of word line combs. In one embodiment, the first group of vertical bit lines may comprise a first bit line and the first bit line may be connected to a first word line comb of the plurality of word line combs via a first non-volatile storage element and may be connected to a second word line comb of the plurality of word line combs via a second non-volatile storage element. The second word line comb may be located above the first word line comb (e.g., the second word line comb may be located on the top most layer of a plurality of word line comb layers). Various embodiments of processes for performing a forming operation are described later in reference to FIGS. 20B-20C.

In step 2006, it is determined that the first set of non-volatile storage elements have been formed. In one embodiment, a sensing operation may be performed to test the resistance of each non-volatile storage element of the first set of non-volatile storage elements to determine whether each non-volatile storage element of the first set has been properly formed or has obtained a particular resistance value. In step 2008, a first reset operation is performed to the first set of non-volatile storage elements in response to determining that the first set of non-volatile storage elements have been formed. In one embodiment, the first reset operation causes each non-volatile storage element of the first set to be placed into a higher resistance state than the resistance state caused by the first forming operation.

In step 2010, a second group of vertical bit lines connected to the plurality of word line combs different from the first group of vertical bit lines is determined. In one example, the second group of vertical bit lines may include a second bit line corresponding with bit line 1804 in FIG. 18A. In some cases, the number of vertical bit lines in the second group of vertical bit lines may be greater than the number of vertical bit lines in the first group of vertical bit lines. In step 2012, a second forming operation is performed for a second set of non-volatile storage elements connected to the second group of vertical bit lines and the plurality of word line combs. The second forming operation may be performed subsequent to the first forming operation. In one embodiment, the second group of vertical bit lines may comprise a second bit line and the second bit line may be connected to a first word line comb of the plurality of word line combs via a third non-volatile storage element and may be connected to a second word line comb of the plurality of word line combs via a fourth non-volatile storage element. The second word line comb may be located above the first word line comb (e.g., the first word line comb may be located on the bottom most layer of a plurality of word line comb layers).

In some embodiments, a cross-point memory array may include a plurality of word line comb layers (e.g., 16 total word line comb layers) and the first forming operation may be concurrently performed on non-volatile storage elements on all of the plurality of word line comb layers. In another embodiment, the first forming operation may be concurrently performed on non-volatile storage elements connected to a subset of the plurality of word line comb layers. The first forming operation may be performed for a first group of the plurality of word line comb layers (e.g., the forming operation may be performed on all 16 layers out of 16 word line comb layers or performed on only four layers out of 16 word line comb layers). In the case that forming is not applied to non-volatile storage elements on all of the word line comb layers of the plurality of word line comb layers at the same time, the other layers of the plurality of word line comb layers may be set to a lower voltage (e.g., 1.5V or another voltage that is less than a forming voltage necessary to form a non-volatile storage element) than the voltage applied to the layers in which the non-volatile storage elements being formed reside.

In some embodiments, a second reset operation may be performed to the second set of non-volatile storage elements in response to determining that the second set of non-volatile storage elements have been formed. The second reset operation may cause each non-volatile storage element of the second set to be placed into a higher resistance state than the resistance state caused by the second forming operation. In some cases, the first set of non-volatile storage elements may be formed, verified, and reset before the second set of non-volatile storage elements are formed. After the second set of non-volatile storage elements have been formed, the second set may be reset.

Figure 20B:
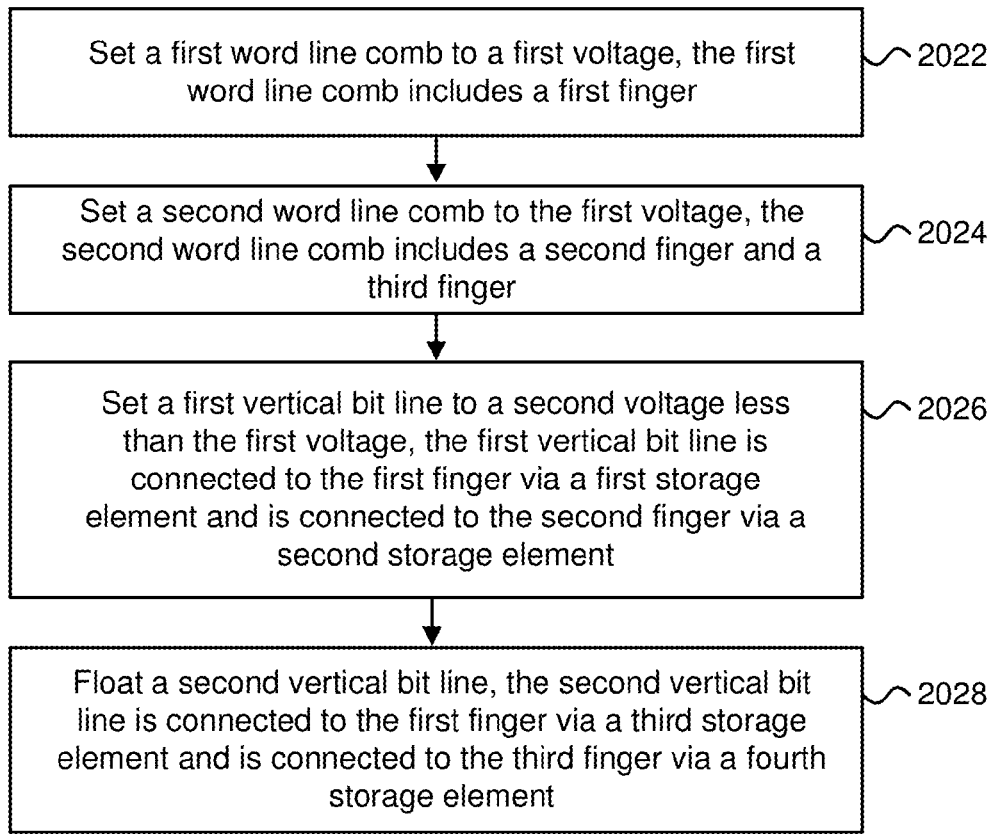
FIG. 20B is a flowchart describing one embodiment of a process for performing a forming operation.

FIG. 20B is a flowchart describing one embodiment of a process for performing a forming operation. The process described in FIG. 20B is one example of a process for implementing step 2004 in FIG. 20A. In one embodiment, the process of FIG. 20B may be performed by a memory system or by a memory controller, such as controller 25 in FIG. 2.

In step 2022, a first word line comb is set to a first voltage. The first word line comb may include a first finger. The first finger may be one of a plurality of fingers associated with the first word line comb. In one example, the first finger may correspond with finger 1802 in FIG. 18A. In step 2024, a second word line comb is set to the first voltage. The second word line comb may include a second finger and a third finger. In one example, the second finger may correspond with finger 1807 in FIG. 18A and the third finger may correspond with finger 1806 in FIG. 18A. In one embodiment, the first voltage may comprise 3.0V. In step 2026, a first vertical bit line is set to a second voltage less than the first voltage. The first vertical bit line may be connected to the first finger via a first storage element and may be connected to the second finger via a second storage element. In one embodiment, the second voltage may comprise 0V. In step 2028, a second vertical bit line may be floated or not electrically connected to a global bit line. The second vertical bit line may be connected to the first finger via a third storage element and may be connected to the third finger via a fourth storage element.

Figure 20C:
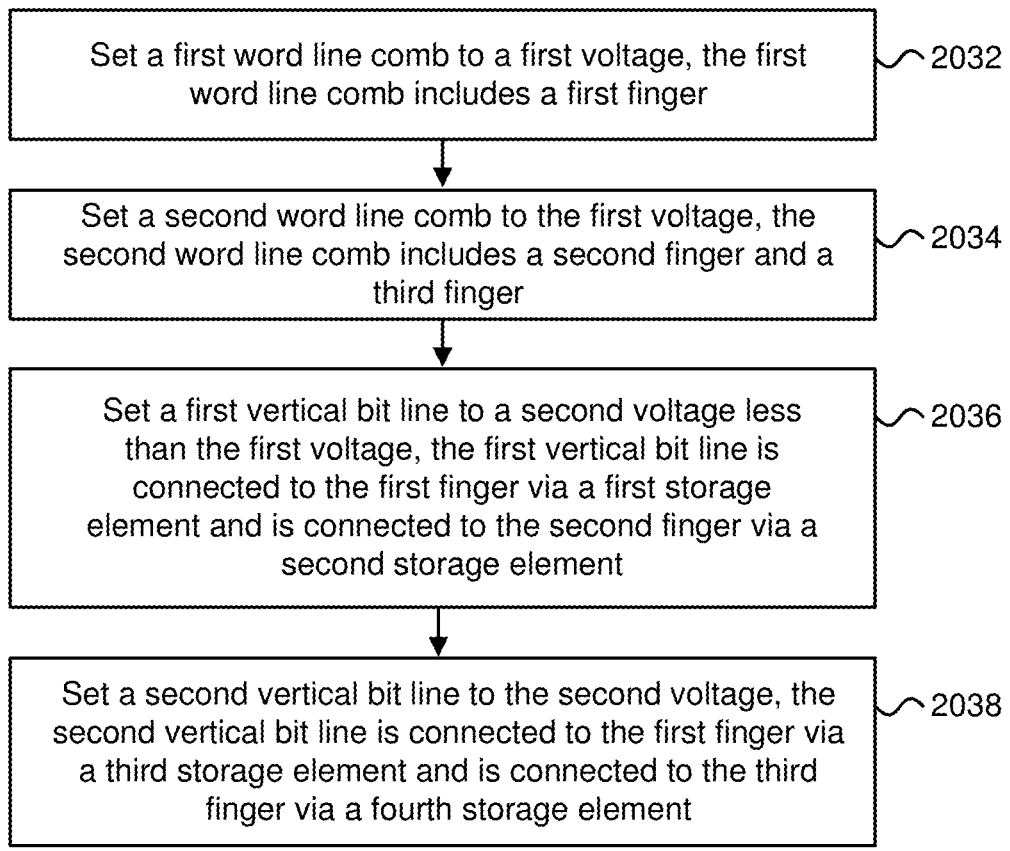
FIG. 20C is a flowchart describing an alternative embodiment of a process for performing a forming operation.

FIG. 20C is a flowchart describing an alternative embodiment of a process for performing a forming operation. The process described in FIG. 20C is one example of a process for implementing step 2004 in FIG. 20A. In one embodiment, the process of FIG. 20C may be performed by a memory system or by a memory controller, such as controller 25 in FIG. 2.

In step 2032, a first word line comb is set to a first voltage. The first word line comb may include a first finger. The first finger may be one of a plurality of fingers associated with the first word line comb. In one example, the first finger may correspond with finger 1802 in FIG. 18C. In step 2034, a second word line comb is set to the first voltage. The second word line comb may include a second finger and a third finger. In one example, the second finger may correspond with finger 1807 in FIG. 18C and the third finger may correspond with finger 1806 in FIG. 18C. In one embodiment, the first voltage may comprise 3.0V. In step 2036, a first vertical bit line is set to a second voltage less than the first voltage. The first vertical bit line may be connected to the first finger via a first storage element and may be connected to the second finger via a second storage element. In one embodiment, the second voltage may comprise 0V. In step 2038, a second vertical bit line may be set to the second voltage. The second vertical bit line may be connected to the first finger via a third storage element and may be connected to the third finger via a fourth storage element. In this case, the first storage element, the second storage element, the third storage element, and the fourth storage element may be formed at the same time or concurrently.

One embodiment of the disclosed technology includes a memory array and one or more managing circuits in communication with the memory array. The memory array includes a first group of vertical bit lines connected to a plurality of word line combs. The first group of vertical bit lines includes a first bit line. Each word line comb of the plurality of word line combs is connected to the first bit line. The memory array includes a second group of vertical bit lines connected to the plurality of word line combs. The second group of vertical bit lines includes a second bit line. Each word line comb of the plurality of word line combs is connected to the second bit line. The one or more managing circuits cause a first forming operation to be performed to a first set of non-volatile storage elements connected to the first group of vertical bit lines and the plurality of word line combs. The one or more managing circuits cause a second forming operation to be performed to a second set of non-volatile storage elements connected to the second group of vertical bit lines and the plurality of word line combs. The second forming operation is performed subsequent to the first forming operation.

In one embodiment, each word line comb of the plurality of word line combs is located at a different layer of a plurality of word line comb layers. In another embodiment, the plurality of word line combs includes a first word line comb and a second word line comb that is located below the first word line comb. In another embodiment, the memory array is associated with a total number of word line comb layers. The plurality of word line combs comprises word line combs at a plurality of layers less than the total number of word line comb layers.

One embodiment of the disclosed technology includes determining a first group of vertical bit lines connected to a plurality of word line combs. The first group of vertical bit lines includes a first bit line. Each word line comb of the plurality of word line combs is connected to the first bit line. The method further comprises performing a first forming operation for a first set of non-volatile storage elements connected to the first group of vertical bit lines and the plurality of word line combs and determining a second group of vertical bit lines connected to the plurality of word line combs different from the first group of vertical bit lines. The second group of vertical bit lines includes a second bit line. Each word line comb of the plurality of word line combs is connected to the second bit line. The method further comprises performing a second forming operation for a second set of non-volatile storage elements connected to the second group of vertical bit lines and the plurality of word line combs. The second forming operation is performed subsequent to the first forming operation.

One embodiment of the disclosed technology includes performing a first forming operation for a first set of non-volatile storage elements connected to a first group of vertical bit lines and a plurality of word line combs. The first group of vertical bit lines is connected to the plurality of word line combs. The first group of vertical bit lines includes a first bit line. Each word line comb of the plurality of word line combs is connected to the first bit line. The method further comprises performing a second forming operation for a second set of non-volatile storage elements connected to a second group of vertical bit lines and the plurality of word line combs. The second forming operation is performed subsequent to the first forming operation. The second group of vertical bit lines is connected to the plurality of word line combs. The second group of vertical bit lines includes a second bit line. Each word line comb of the plurality of word line combs is connected to the second bit line. The performing a first forming operation is performed prior to any programming operations being performed to the first set of non-volatile storage elements. The performing a second forming operation is performed prior to any programming operations being performed to the second set of non-volatile storage elements.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
   a memory array, the memory array includes a first group of vertical bit lines connected to a plurality of word line combs, the first group of vertical bit lines includes a first bit line, each word line comb of the plurality of word line combs is connected to the first bit line, the memory array includes a second group of vertical bit lines connected to the plurality of word line combs, the second group of vertical bit lines includes a second bit line, each word line comb of the plurality of word line combs is connected to the second bit line; and
   one or more managing circuits in communication with the memory array, the one or more managing circuits cause a first forming operation to be performed to a first set of non-volatile storage elements connected to the first group of vertical bit lines and the plurality of word line combs, the one or more managing circuits cause a second forming operation to be performed to a second set of non-volatile storage elements connected to the second group of vertical bit lines and the plurality of word line combs, the second forming operation is performed subsequent to the first forming operation, the number of vertical bit lines in the second group of vertical bit lines is greater than the number of vertical bit lines in the first group of vertical bit lines.

2. The non-volatile storage system of claim 1, wherein:
each word line comb of the plurality of word line combs is located at a different layer of a plurality of word line comb layers.

3. The non-volatile storage system of claim 1, wherein:
the plurality of word line combs includes a first word line comb and a second word line comb, the first word line comb is located above the second word line comb.

4. The non-volatile storage system of claim 1, wherein:
the memory array is associated with a total number of word line comb layers, the plurality of word line combs comprises word line combs at a plurality of layers less than the total number of word line comb layers.

5. The non-volatile storage system of claim 1, wherein:
the memory array is monolithically formed in one or more physical levels of memory cells having active areas disposed above a silicon substrate.

6. The non-volatile storage system of claim 1, wherein:
each non-volatile storage element of the first set of non-volatile storage elements includes a reversible resistance-switching element without an isolation element in series with the reversible resistance-switching element.

7. The non-volatile storage system of claim 1, wherein:
the memory array comprises a three-dimensional memory array.

8. A method for operating a non-volatile storage system, comprising:
determining a first group of vertical bit lines connected to a plurality of word line combs, the first group of vertical bit lines includes a first bit line, each word line comb of the plurality of word line combs is connected to the first bit line;
performing a first forming operation for a first set of non-volatile storage elements connected to the first group of vertical bit lines and the plurality of word line combs;
determining a second group of vertical bit lines connected to the plurality of word line combs different from the first group of vertical bit lines, the second group of vertical bit lines includes a second bit line, each word line comb of the plurality of word line combs is connected to the second bit line; and
performing a second forming operation for a second set of non-volatile storage elements connected to the second group of vertical bit lines and the plurality of word line combs, the second forming operation is performed subsequent to the first forming operation, the number of vertical bit lines in the second group of vertical bit lines is greater than the number of vertical bit lines in the first group of vertical bit lines.

9. The method of claim 8, wherein:
each word line comb of the plurality of word line combs is located at a different layer of a plurality of word line comb layers.

10. The method of claim 8, wherein:
the plurality of word line combs includes a first word line comb and a second word line comb, the first word line comb is located above the second word line comb.

11. The method of claim 8, wherein:
the plurality of word line combs comprises word line combs at each layer of a plurality of word line comb layers.

12. The method of claim 8, wherein:
the performing a first forming operation includes applying a forming voltage across non-volatile storage elements on all of the plurality of word line comb layers.

13. The method of claim 8, wherein:
the first set of non-volatile storage elements is part of a memory array, the memory array is associated with a total number of word line comb layers, the plurality of word line combs comprises word line combs at a plurality of layers less than the total number of word line comb layers.

14. The method of claim 13, wherein:
the memory array is monolithically formed in one or more physical levels of memory cells having active areas disposed above a silicon substrate.

15. The method of claim 8, wherein:
the first bit line connects to a first word line comb of the plurality of word line combs via a first non-volatile storage element and connects to a second word line comb of the plurality of word line combs via a second non-volatile storage element different from the first non-volatile storage element.

16. The method of claim 8, wherein:
the performing a first forming operation includes setting a first word line comb of the plurality of word line combs to a first voltage and setting a second word line comb of the plurality of word line combs to the first voltage, the first word line comb includes a first finger, the second word line comb includes a second finger, the performing a first forming operation includes setting a first vertical bit line of the first group of vertical bit lines to a second voltage less than the first voltage, the first vertical bit line is connected to the first finger via a first storage element and is connected to the second finger via a second storage element.

17. The method of claim 16, wherein:
the setting a first vertical bit line to a second voltage includes setting the first vertical bit line to the second voltage such that a forming voltage is applied across the first storage element and the forming voltage is applied across the second storage element.

18. The method of claim 8, wherein:
the first set of non-volatile storage elements is part of a memory array, each non-volatile storage element of the first set of non-volatile storage elements includes a reversible resistance-switching element without an isolation element in series with the reversible resistance-switching element.

19. The method of claim 8, wherein:
the first set of non-volatile storage elements is part of a memory array, the memory array comprises a three-dimensional memory array.

20. A method for operating a non-volatile storage system, comprising:
performing a first forming operation for a first set of non-volatile storage elements connected to a first group of vertical bit lines and a plurality of word line combs, the first group of vertical bit lines is connected to the plurality of word line combs, the first group of vertical bit lines includes a first bit line, each word line comb of the plurality of word line combs is connected to the first bit line; and
performing a second forming operation for a second set of non-volatile storage elements connected to a second group of vertical bit lines and the plurality of word line combs, the second forming operation is performed subsequent to the first forming operation, the second group of vertical bit lines is connected to the plurality of word line combs, the second group of vertical bit lines includes a second bit line, each word line comb of the plurality of word line combs is connected to the second bit line, the performing a first forming operation is performed prior to any programming operations being performed to the first set of non-volatile storage elements, the performing a second forming operation is performed prior to any programming operations being performed to the second set of non-volatile storage elements, the number of vertical bit lines in the second group of vertical bit lines is greater than the number of vertical bit lines in the first group of vertical bit lines.

21. The method of claim 20, wherein:
each word line comb of the plurality of word line combs is located at a different layer of a plurality of word line comb layers.

22. The method of claim 20, wherein:
the plurality of word line combs includes a first word line comb and a second word line comb, the first word line comb is located above the second word line comb.

23. The method of claim 20, wherein:
the performing a first forming operation includes applying a forming voltage across non-volatile storage elements on all of the plurality of word line comb layers.

24. The method of claim 20, wherein:
the first set of non-volatile storage elements is part of a memory array, the memory array is associated with a total number of word line comb layers, the plurality of word line combs comprises word line combs at a plurality of layers less than the total number of word line comb layers.

25. The method of claim 20, wherein:
the first set of non-volatile storage elements is part of a memory array, each non-volatile storage element of the first set of non-volatile storage elements includes a reversible resistance-switching element without an isolation element in series with the reversible resistance-switching element, the memory array comprises a three-dimensional memory array.

* * * * *